US006548866B2

(12) United States Patent
Noguchi

(10) Patent No.: US 6,548,866 B2
(45) Date of Patent: *Apr. 15, 2003

(54) FIELD EFFECT TRANSISTOR WITH REDUCED NARROW CHANNEL EFFECT

(75) Inventor: Mitsuhiro Noguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/878,339

(22) Filed: Jun. 12, 2001

(65) Prior Publication Data

US 2002/0027245 A1 Mar. 7, 2002

Related U.S. Application Data

(63) Continuation of application No. 09/455,159, filed on Dec. 6, 1999, now Pat. No. 6,268,629.

(30) Foreign Application Priority Data

Dec. 7, 1998 (JP) .......................... 10-347045

(51) Int. Cl.7 ............................................. H01L 29/78
(52) U.S. Cl. ....................................................... 257/345
(58) Field of Search ................................ 257/288, 335, 257/345, 596, 597; 438/259

(56) References Cited

U.S. PATENT DOCUMENTS

| 5,923,070 A | 7/1999 | Yamada | 257/408 |
|---|---|---|---|
| 5,966,614 A | 10/1999 | Park et al. | 438/424 |
| 5,969,393 A | 10/1999 | Noguchi | 257/396 |
| 6,017,801 A | 1/2000 | Youn | 438/424 |
| 6,051,479 A | 4/2000 | Hong | 438/425 |
| 6,093,951 A | 7/2000 | Burr | 257/408 |
| 6,268,629 B1 * | 7/2001 | Noguchi | 257/345 |

FOREIGN PATENT DOCUMENTS

JP 9-237829 9/1997

OTHER PUBLICATIONS

Park, T. et al., "Correlation between gate Oxide Reliability and the profile of the Trench Top Corner in shallow Trench Isolation (STI)", IEEE IEDM Technical Digest, pp. 747–750 (1996).

* cited by examiner

Primary Examiner—Wael Fahmy
Assistant Examiner—Marcos D. Pizarro-Crespo
(74) Attorney, Agent, or Firm—Finnegan, Henderson, Farabow, Garrett & Dunner, L.L.P.

(57) ABSTRACT

In a field effect transistor, an element isolation trench is formed around the element region on the major surface of a silicon substrate. A gate electrode is formed on the major surface in the element region via a gate insulating film. Source and drain regions are formed on the major surface of the element region to oppose via a channel region under the gate electrode. The channel region has a main portion having an upper surface at a level higher than the upper end portion of a trench side wall, and a side portion having an upper surface tilting downward from the main portion to the upper end portion of the trench side wall. The dopant impurity in the channel region has a concentration peak located at a level lower than the upper end portion of the trench side wall. The distance from the upper surface of the main portion to the concentration peak is larger than that from the upper surface of the side portion to the peak.

12 Claims, 13 Drawing Sheets

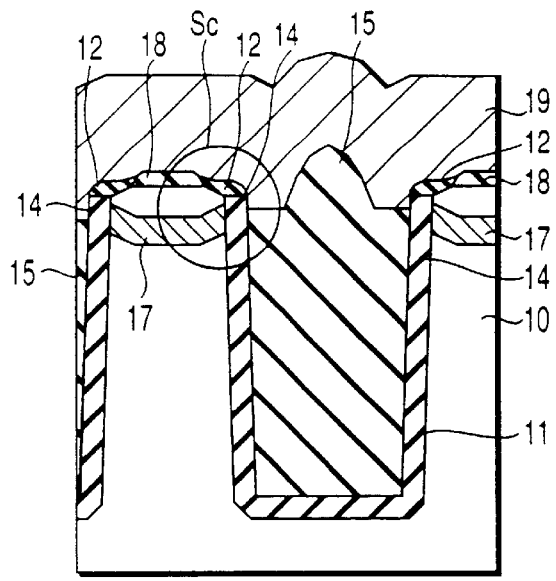
FIG. 1A
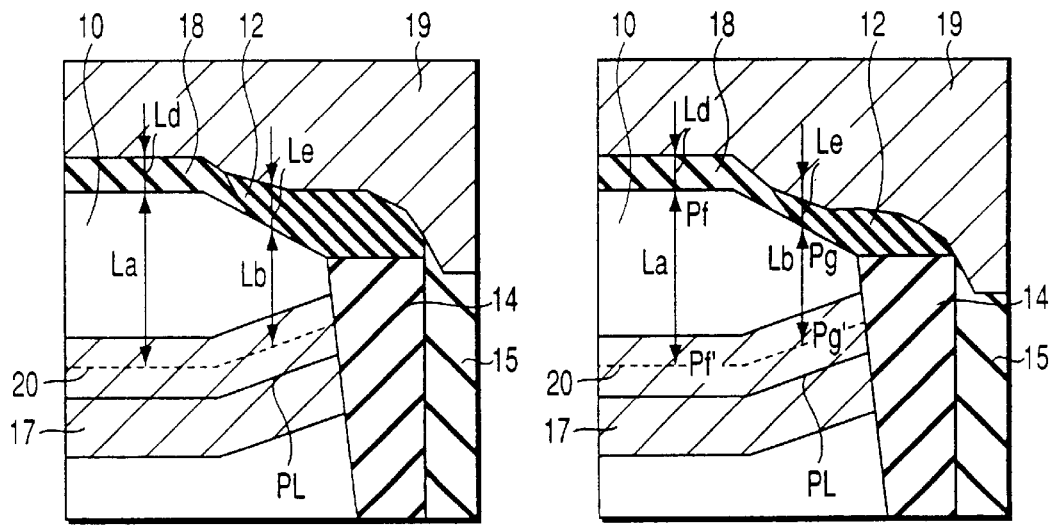
FIG. 1B
FIG. 1C
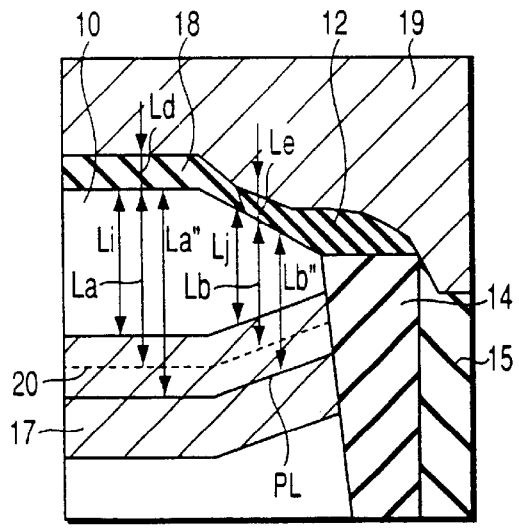
FIG. 1D

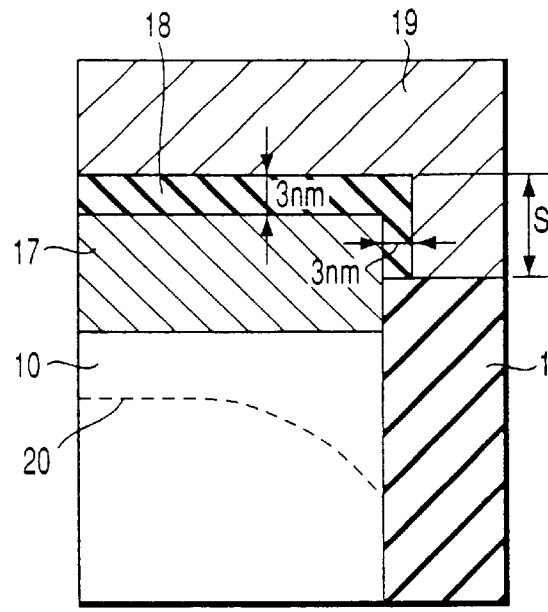
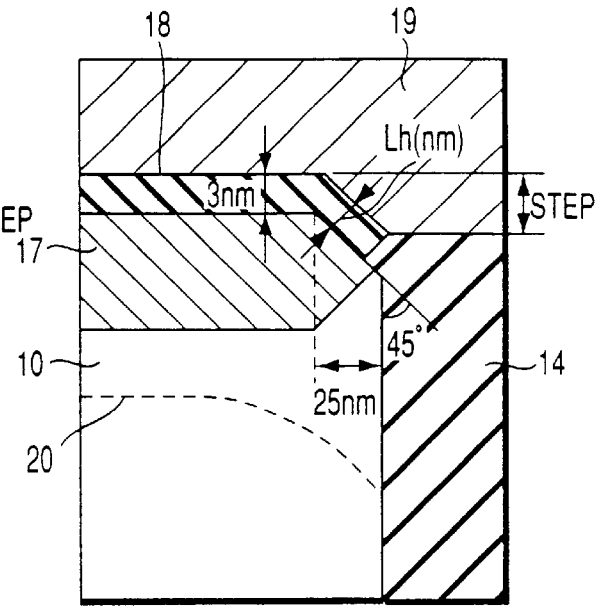
FIG. 5A          FIG. 5B
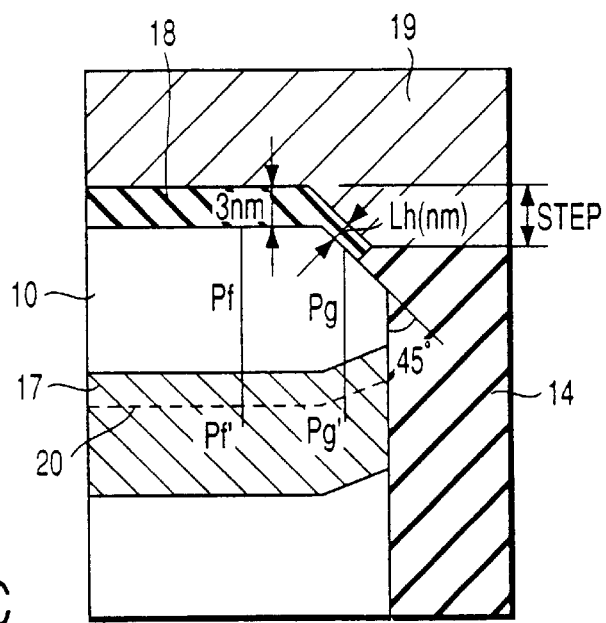
FIG. 5C

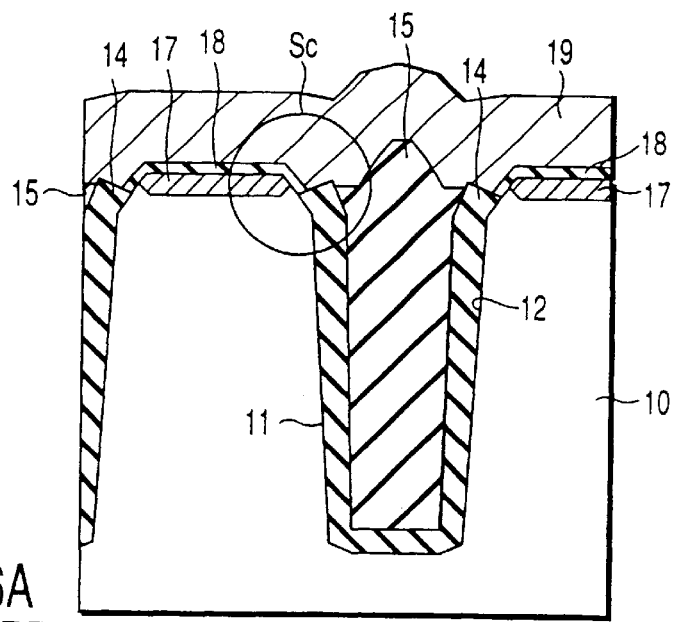
FIG. 16A
PRIOR ART
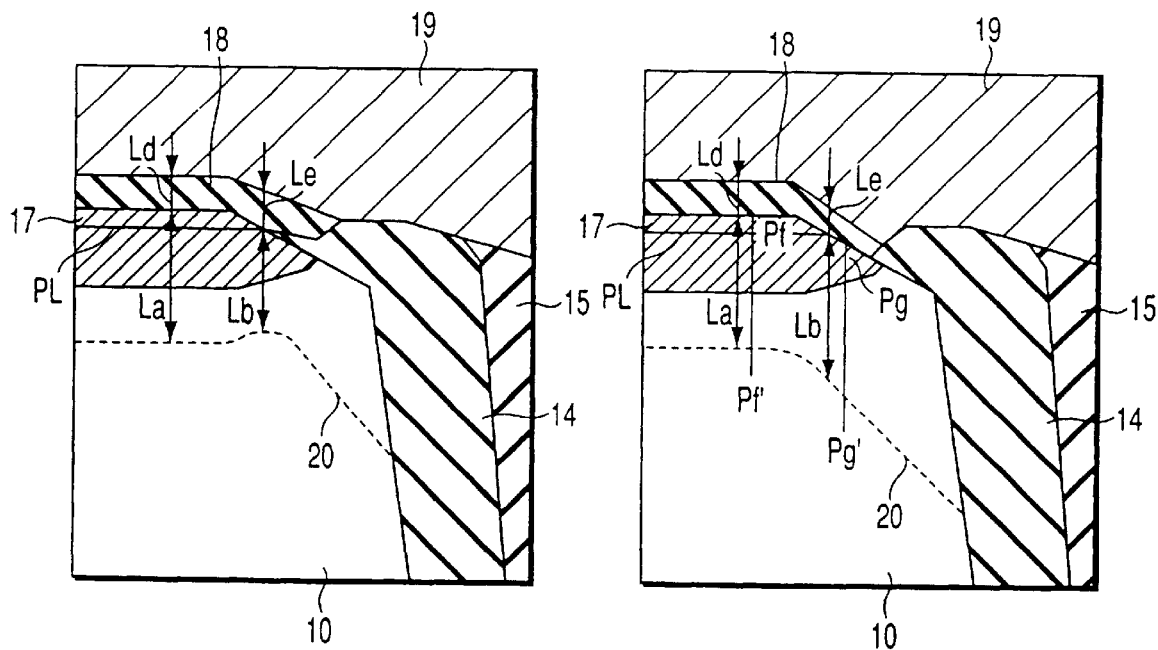
FIG. 16B
PRIOR ART
FIG. 16C
PRIOR ART

FIELD EFFECT TRANSISTOR WITH REDUCED NARROW CHANNEL EFFECT

This is a continuation of application Ser. No. 09/455,159, filed Dec. 6, 1999, now U.S. Pat. No. 6,268,629.

BACKGROUND OF THE INVENTION

The present invention relates to a semiconductor device in which an FET (field effect transistor) with a MIS (Metal/Insulator/Semiconductor) structure is formed in an element region defined by trench isolation.

In recent years, as element isolation for a semiconductor integrated circuit, not the conventional element isolation using selective oxidation but so-called trench isolation wherein a trench is formed in a semiconductor substrate and an insulating film is buried in the trench to form an element isolation region is used. In this trench isolation, the bird's beak that is a problem in selective oxidation (LOCOS) is small, and the breakdown voltage can be kept satisfactory even when the element isolation width is small. Hence, the degree of integration can be increased.

However, in a MISFET formed by the conventional trench isolation process, the threshold voltage of side portions on both sides in the channel width direction undesirably becomes low. This is because when the surface layer is cleaned and exposed in the previous step of forming a gate insulating film on the surface of the semiconductor layer, the gate electrode is readily partially formed at a level lower than the interface between the semiconductor substrate and the gate insulating film.

FIG. 15A is a sectional view showing the structure of a conventional MISFET. Referring to FIG. 15A, the MISFET has a semiconductor substrate 10, element isolation trench 11 formed around an element region, insulating film 14 formed on the inner wall of the trench 11, insulating film 15 buried in the trench 11, impurity-implanted region 17, gate insulating film 18, and gate electrode 19. Although not illustrated, source and drain regions are formed on the major surface of the substrate 10 on both sides of the channel region underneath the gate electrode 19.

The major surface of the element region is almost flat. However, the end portions near the periphery of the trench (on both sides in the channel width direction) have tilt surfaces which are inevitably formed due to the manufacturing process. More specifically, to form the trench 11, a buffer layer and etching stopper film are deposited on the substrate 10. After a pattern is formed on these layers, a trench having a depth of 0.1 to 2 μm is formed in the substrate 10. Next, the substrate 10 is annealed in an oxygen atmosphere to form the silicon oxide film 14 having a thickness of 5 to 100 nm in the trench 11. During formation of this oxide film 14, oxidation of the silicon substrate 10 progresses from the surface of the sides due to oxidation species such as oxygen or $H_2O$ entering the buffer layer. For this reason, the buffer layer becomes thicker at the trench side wall than at the flat portion to form a bird's beak, and a tilt surface due to the bird's beak is formed on the upper surface of the side portions of the element region.

Referring to FIG. 15A, a dotted line 20 represents the lower end of the channel depletion layer when the threshold voltage is applied to the gate electrode. La and Lb represent vertical distances (depths) from the interface between the gate insulating film 18 and the substrate 10 to the depletion layer end, which are measured in the vertical direction with respect to the major surface of the substrate. La is the depth at the flat substrate portion (main portion), and Lb is the depth at the tilt substrate portion (side portion) along the periphery of the trench. In the conventional process of implanting channel ions to a portion near the interface, when the bird's beak at the edge of the buffer layer is small, a channel ion profile is formed to a predetermined depth from the interface between the gate insulating film 18 and the substrate 10.

Prior art 1 will be described next in detail in which the threshold voltage lowers in the arrangement shown in FIG. 15A. FIG. 15B is an enlarged view of a side portion Sc in FIG. 15A. Assume that the gate insulating film 18 has a uniform film thickness at the flat substrate portion and at the side portion along the periphery of the trench, or the gate insulating film 18 becomes thin at the side portion. In this case, as shown in FIG. 15B, the side portion of the substrate 10 is surrounded by the gate electrode 19 via the gate insulating film 18 at the upper and side surface portions. For this reason, the electric field from the electrode 19 concentrates in the side portion rather than in the main portion. When the gate insulating film 18 is thin at the side portion, field concentration is more noticeable.

In the conventional structure shown in FIG. 15B in which the distances La and Lb are almost equal, the substrate 10 is depleted from the side surface at the side portion due to the electric field from the side surface. For this reason, charge share of depletion layer charges from the semiconductor substrate surface decreases in correspondence with the depletion layer. The threshold voltage of the MISFET at the side portion becomes lower than that of the MSIFET at the main portion, resulting in a parasitic side transistor. A line PL in FIG. 15B indicates the position of the peak of the dopant concentration in the channel region.

FIG. 16A shows prior art 2 in which the threshold voltage is prevented from becoming lower even when a gate electrode 19 is partially formed at a level lower than the upper surface of a semiconductor substrate 10. This structure has been discussed in, e.g., Tai-Su Park, Yu Gyun Shin, Han Sin Lee, Moon Han Park, Sang Dong, Kwon, Ho Kyu Kang, Young Bum Koh, and Moon Yong Lee, International Electron Devices Meeting Technical Digest, 1996, pp. 747–750, FIG. 11A. The film structure other than the channel profile structure is known.

In prior art 2, the tilt surface of the side portion of the element region is wider. An insulating film 14 also remains on this tilt surface. This structure is preferable not to form any parasitic transistor having a low threshold voltage at the side portion. In this case, at a portion where the insulating film 14 is formed on the tilt surface, the channel impurity having its maximal concentration value near the surface stays in the insulating film 14 without entering the substrate 10. Hence, the concentration on the surface is lower at the side portion of the element region than at the main portion.

FIGS. 16B and 16C are enlarged views of a side portion Sc between a gate electrode 19 and the substrate 10. A dotted line 20 indicates the channel depletion layer end. La and Lb represent depths from the interface between a gate insulating film 18 and the substrate 10, which are measured in the vertical direction with respect to the major surface of the substrate. La is the depth at the flat semiconductor substrate portion (main portion), and Lb is the depth at the side along the periphery of the trench. A line PL in FIGS. 16B and 16C indicates the position of the peak of the dopant concentration in the channel region.

In prior art 2, the insulating film 14 is formed in advance on the tilt surface of the side portion. Referring to FIG. 16B, at the side portion of the semiconductor substrate along the periphery of the trench, which is covered with the insulating film 14, the insulating film sandwiched by the gate electrode 19 and semiconductor substrate 10 can be made thicker than the gate insulating film 18. More specifically, the insulating film 14 at the side portion is formed thicker than the gate insulating film 18 at the main portion such that the insulating film 14 is left at the side portion. In this state, the gate insulating film 18 is formed. With this process, the insulating film 14 thicker than the gate insulating film 18 is formed at the side portion between the gate electrode 19 and the substrate 10. In the region covered with the insulating film 14, a parasitic transistor with a low threshold voltage is hard to form.

On the other hand, at the side portion not covered with the insulating film 14, the threshold voltage becomes low. A structure that does not lower the threshold voltage will be described first, and then, a structure that lowers the threshold voltage will be described.

In FIG. 16B, Le is the thickness of the gate insulating film at the side portion, and Ld is the thickness of the gate insulating film 18 at the main portion. When the thickness of the gate insulating film at the side portion almost equals that at the main portion, Ld almost equals Le. Especially, in prior art 2, the insulating film 14 readily remains on the side-portion tilt surface, as shown in FIG. 16B. Preferably, the gate insulating film at the side portion becomes thicker due to the remaining insulating film 14, to satisfy Le>Ld.

Where $Q_B$ is the absolute value of charges of acceptors in the semiconductor substrate 10, $\epsilon$ is the permittivity of the gate insulating film 18, t is the thickness of the gate insulating film 18, $V_{FB}$ is the work function difference between the gate electrode 19 and the substrate 10, and $2\phi_F$ is the inversion potential, a threshold voltage $V_{th}$ of the transistor is given by $$V_{th}=V_{FB}+2\phi_F+Q_B \cdot t/\epsilon \quad (1)$$

This reveals that as the gate insulating film thickness t increases, the threshold voltage $V_{th}$ becomes high even when the value $Q_B$ does not change. The value $Q_B$ is determined by the substrate profile and substrate bias and does not depend on the gate insulating film thickness. For this reason, when the gate insulating film at the side portion becomes thicker than that at the main portion, the threshold voltage at the side portion rises to prevent any side parasitic transistor.

Especially, when the thickness Le is sufficiently larger than the thickness Ld, the so-called surface potential at the interface between the gate insulating film 18 and the substrate 10 increases at the side portion rather than at the main portion. Hence, as shown in FIG. 16B, the depletion layer width Lb at the side portion is smaller than the depletion layer width La at the main portion.

FIG. 16C illustrates the side portion Sc when the insulating film 14 rarely remains on the side-portion tilt surface of the conventional structure shown in FIG. 16A, and the gate insulating film becomes thinner at the side portion. In this case, the gate insulating film at the side portion has a thickness equal to or smaller than that at the main portion. When Le<Ld, the threshold voltage at the side portion becomes low from equation (1).

Especially, in a region 17 of prior art 2, where the substrate impurity profile has an impurity peak on the surface, the threshold voltage at the side portion further drops. Since the implantation depth is smaller at the side portion than at the main portion because of the insulating film 14, ions are implanted closer to the surface. FIG. 17 shows the impurity profile at the main portion along a line Pf–Pf' and that at the side portion along a line Pg–Pg' in FIG. 16C. Pf and Pg indicate the interfaces between the gate insulating film 18 and the substrate 10 at the main and side portions, respectively. Pf' and Pg' indicate the channel depletion layer ends at the main and side portions, respectively.

Ions implanted in the surface portion of the impurity profile at the main portion do not remain in the substrate 10 at the side portion. For this reason, the substrate impurity concentration becomes low near the surface at the side portion, and the impurity amount at the side portion of the ion-implanted region 17 becomes smaller than that at the main portion. At the side portion, the depletion layer expands to result in La<Lb. Since the impurity concentration at the depletion layer end becomes lower as the depth increases, the value $Q_B$ at the main portion is smaller than that at the side portion. Hence, the threshold voltage at the side portion more easily becomes low.

In prior art 2, the process is complicated because a process of forming the sacrificial insulating film for ion implantation and removing the insulating film is necessary. When the sacrificial insulating film is formed by oxidizing or nitriding the substrate 10, the main portion of the substrate 10 is oxidized or nitrided and retreats from the side portion protected by the buffer layer. This readily results in La<Lb, and the threshold voltage easily lowers. In prior art 2, since the side-portion tilt surface is covered with the insulating film 15, channel ions are not implanted into the semiconductor substrate 10 of the tilt surface. For this reason, the threshold voltage at the side portion more easily drops.

FIG. 18 shows the structure of prior art 3 for preventing the threshold voltage from dropping at the side portion. In this structure, boron or indium is implanted at a dose of $10^{12}$ to $10^{16}$ cm$^{-2}$ and an acceleration energy of 1 to 300 keV to form a region 21 where the acceptor impurity concentration on the trench side surface is increased. This increases the substrate impurity concentration at the side portion and increases QB of equation (1). Hence, the depletion layer width at the side portion can be made smaller than that at the main portion, and the threshold voltage $V_{th}$ can be increased.

In the manufacturing process of prior art 3, however, the number of steps of channel ion implantation increases. Especially, for transistors having a plurality of conductivity types in, e.g., a CMOS circuit, ions with the same conductivity type as that of each well must be implanted into the well. To do this, after a trench region is formed, a resist is applied to the trench region, and lithography is performed to form a mask for ion implantation. In this case, since the resist comes into contact with a portion near the inner wall of the trench, impurity contamination due to organic substances or metals from the resist to the trench poses a problem.

When a MISFET is formed, the heavily doped region 21 of the well comes into contact with heavily doped source and drain regions which have a conductivity type opposite to that of the well. For this reason, the depletion layer capacitance of the source and drain regions increases to increase the tunnel leakage current from the junction. In addition, to implant ions of a sufficient dose into the side surface, a dose twice or more that of channel ion implantation is needed. Hence, defects due to ion implantation on the wall and bottom surfaces of the trench pose a problem.

As described above, in the conventional semiconductor element isolation structures, the element isolation insulating film is etched to a level lower than that of the semiconductor region because of the previous step of channel ion implantation and the previous step of gate insulating film formation in forming a MISFET. When the gate insulating film becomes thin at the side portion, a parasitic transistor having a low threshold voltage forms at the side portion of the semiconductor region.

BRIEF SUMMARY OF THE INVENTION

It is an object of the present invention to provide a transistor which does not form any parasitic transistor even when the gate insulating film becomes thin at the side portion of the semiconductor region and can improve the reproducibility of the threshold voltage.

According to the first aspect of the present invention, there is provided a field effect transistor comprising:

a semiconductor substrate;

a channel region and a pair of source/drain regions formed in a surface of the substrate, the source/drain regions opposing each other via the channel region in a channel length direction;

a gate electrode arranged above the channel region and opposing the channel region via a gate insulating film; and a trench formed in the surface of the substrate so as to define an element isolation region adjacent to the channel region in a channel width direction perpendicular to the channel length direction, the trench being covered with an insulating trench side wall, wherein the channel region has a main portion having an upper surface at a level higher than an upper end portion of the trench side wall, and a side portion having an upper surface tilting downward from the main portion to the upper end portion of the trench side wall, and the channel region contains a dopant impurity which has a concentration peak whose part in the main portion is arranged at a level below the upper end portion of the trench side wall, and a first distance from the upper surface of the main portion to the peak is larger than a second distance from the upper surface of the side portion to the peak.

According to the second aspect of the present invention, there is provided a field effect transistor comprising:

a semiconductor substrate;

a channel region and a pair of source/drain regions formed in a surface of the substrate, the source/drain regions opposing each other via the channel region in a channel length direction;

a gate electrode arranged above the channel region and opposing the channel region via a gate insulating film; and a trench formed in the surface of the substrate so as to define an element isolation region adjacent to the channel region in a channel width direction perpendicular to the channel length direction, the trench being covered with an insulating trench side wall, wherein the channel region has a main portion having an upper surface at a level higher than an upper end portion of the trench side wall, and a side portion having an upper surface tilting downward from the main portion to the upper end portion of the trench side wall, and the channel region contains a dopant impurity which has a concentration peak whose part in the main portion is arranged at a level below the upper end portion of the trench side wall, and the peak at the side portion is located at a level higher than that at the main portion.

In the first aspect of the present invention, the dopant impurity in the channel region has a concentration peak set below the upper end portion of the trench side wall, and the first distance from the upper surface of the main portion to the peak is set to be larger than the second distance from the upper surface of the side portion to the peak.

In the second aspect of the present invention, the dopant impurity in the channel region has a concentration peak set below the upper end portion of the trench side wall, and the peak at the side portion is located at a level higher than that at the main portion.

According to the characteristic features of the first and second aspects, hardly any parasitic transistor can be formed even when the gate insulating film becomes thin at the side portion. Hence, the reproducibility of the threshold voltage of the transistor can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a sectional view showing a semiconductor device according to the first embodiment;

FIGS. 1B to 1D are enlarged views of side portions Sc in FIG. 1A, which are formed under different conditions;

FIGS. 5A to 5C are sectional views schematically showing side portion structures according to two prior arts and the first embodiment;

FIG. 16A is a sectional view showing a semiconductor device of prior art 2;

FIGS. 16B and 16C are enlarged views of side portions Sc shown in FIG. 16A, which are formed under different conditions;

DETAILED DESCRIPTION OF THE INVENTION

Figure 2C:
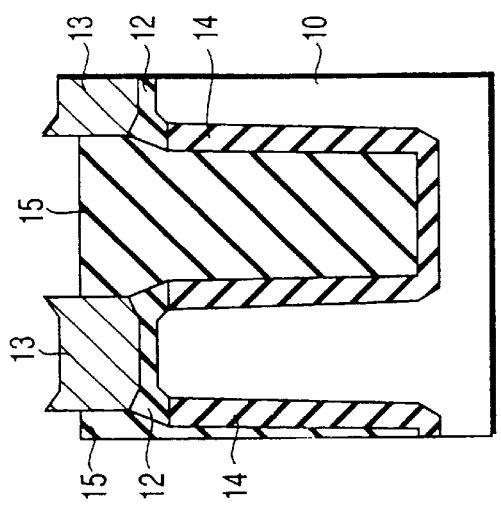
FIGS. 2A to 2F are sectional views showing the steps in the manufacture of the semiconductor device according to the embodiment.

Embodiments of the present invention will be described hereinafter with reference to the accompanying drawings. In the following description, the constituent elements having substantially the same function and arrangement are denoted by the same reference numerals, and a repetitive description will be made only when necessary.

(First Embodiment)

FIG. 1A is a sectional view showing a semiconductor device according to the first embodiment of the present invention. In this embodiment, the shape of the gate insulating film at the side portion and the depth distribution of channel-implanted ions at the side portion are different from those of the prior art shown in FIG. 16A. A side portion means in this invention a side portion of the element region of the substrate, which is adjacent to the trench and extends in the channel length direction and, more particularly, a side portion of the channel region. In other words, the side portion corresponds to each of two end portions in the channel width direction perpendicular to the channel length direction. The channel length direction is the direction in which a pair of source and drain regions (regions 23 in FIGS. 8A and 8B) oppose each other via the channel region.

FIGS. 1B and 1C are enlarged views of side portions Sc in FIG. 1A, which are formed under different conditions. As shown in FIGS. 1B and 1C, the end portion (side portion) of the element region near the trench has a tilt surface. An impurity-implanted region 17 is formed by doping channel ions such that the peak of the dopant impurity concentration is arranged apart from the interface between a gate insulating film 18 and a semiconductor substrate 10 (and below the upper end portion of a side wall 14 of the trench). As will be described later, the peak measured from the interface between the gate insulating film 18 and the semiconductor substrate 10 is at a portion shallower at the side portion than at the flat substrate portion (main portion). For this reason, the channel depletion layer (reference numeral 20 denotes a lower end) formed by applying the threshold voltage to a gate electrode 19 is thinner at the side portion than at the main portion. Referring to FIGS. 1B and 1C, a line PL indicates the position of the peak of the dopant concentration in the channel region.

The manufacturing process of this embodiment will be described with reference to FIGS. 2A to 2F.

Figure 2F:
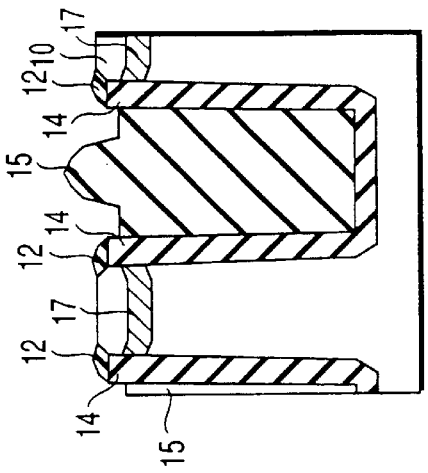
Figure 2B:
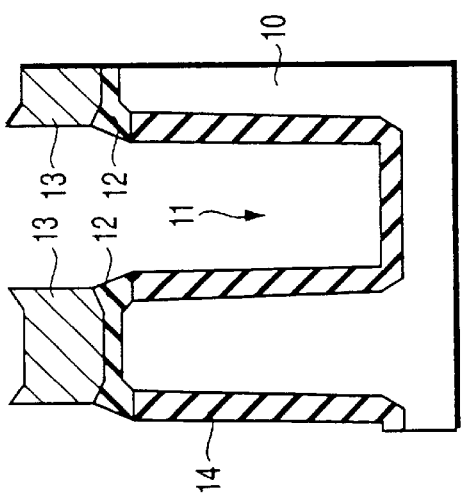
Figure 2E:
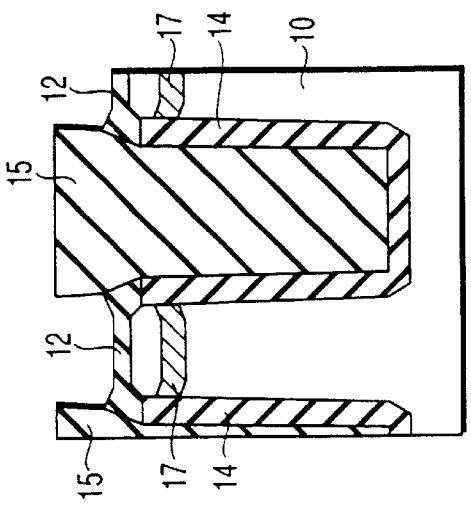
Figure 2A:
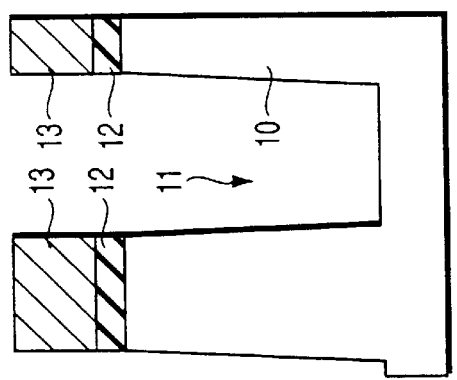

First, as shown in FIG. 2A, a 10- to 500-nm thick etching stopper film 13 of silicon nitride, polysilicon, or amorphous silicon is deposited on the entire surface of the semiconductor substrate 10 containing silicon via a 5- to 50-nm thick buffer layer 12 formed from a silicon oxide film. This etching stopper film 13 preferably has a thickness of 10 nm or more for the purpose of decreasing the stress of the film 13 or etching damage to the substrate 10 when the film 13 is etched and removed.

Subsequently, lithography and etching are performed to form a trench 11 for element isolation to a depth of 0.1 to 2 $\mu$m until it reaches the substrate 10. The tilt angle of the trench 11 is 70° to 90° and, more preferably, 80° to 89° to suppress an increase in the width due to the tilt angle of element isolation and obtain satisfactory element isolation characteristics. To maintain satisfactory electrical isolation from other elements, this trench is preferably formed around the element formation region.

Figure 3A:
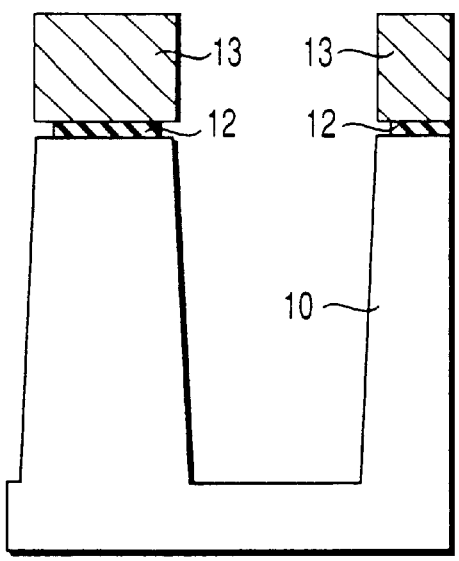
FIGS. 3A and 3B are sectional views showing a modification of the manufacturing process of the first embodiment.
Figure 3B:
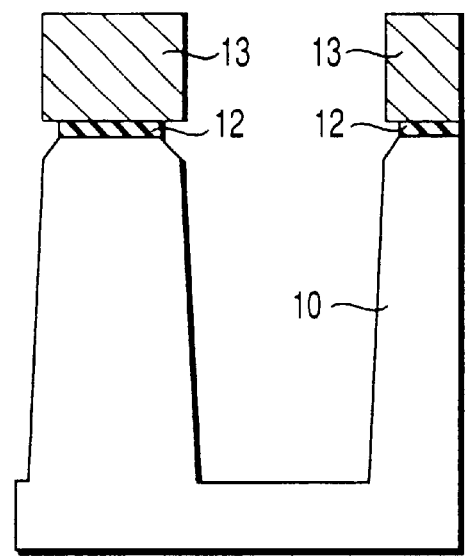

The buffer layer 12 may be etched into the shape shown in FIG. 3A by etching the layer by 5 to 50 nm from the trench walls using a solution of ammonium fluoride or diluted hydrofluoric acid. After that, the substrate 10 may be etched to 5 to 50 nm by a gas plasma using $CF_4$ and $O_2$ to increase the tilt angle of the substrate 10, as shown in FIG. 3B. The angle of the side-portion tilt surface is preferably 5° to 60° and, more preferably, 30° to 46° to obtain the effect for suppressing a decrease in threshold voltage while preventing any decrease in the channel width due to the tilt.

Next, as shown in FIG. 2B, to reduce surface defects in the substrate 10, the structure is annealed in an oxygen atmosphere to form the 5- to 100-nm thick silicon oxide film 14 in the trench 11. During formation of this oxide film 14, oxidation of the substrate 10 progresses from the side surface due to oxidation species such as oxygen or $H_2O$ entering the buffer layer 12. For this reason, the buffer layer 12 becomes thicker near the trench than at the flat portion, and a tilt is formed due to the bird's beak on the upper surface of the side portion of the substrate 10. At this time, the volume of the buffer layer 12 increases due to oxidation of the bird's beak. Since the volume increases from the flat substrate portion (main portion) toward the side portion, parts projecting upward are formed at the two side portions of the buffer layer 12.

Next, as shown in FIG. 2C, a silicon oxide film as an insulating film 15 is deposited to a thickness of 0.1 to 2 $\mu$m that is sufficient to fill the trench 11.

After this, the structure may be annealed in an $H_2O$, or Ar or $N_2$ atmosphere at 800° C. to 1,200° C. to make the structure of the insulating film 15 denser. Etch-back or CMP is performed until the film 13 is exposed.

Figure 2D:
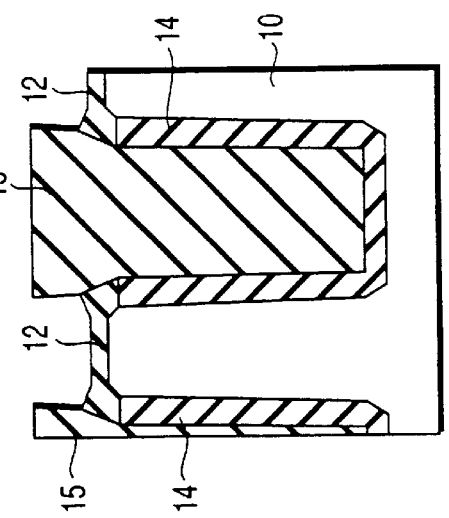

As shown in FIG. 2D, the etching stopper film 13 is removed by etching with selectivity to the buffer layer 12 and insulating film 15. For example, when the film 13 is a silicon film, etching is performed using a gas plasma containing $CF_4$ and $O_2$. When the film 13 is an SiN film, etching is performed using phosphoric acid heated to 80° C. to 200° C.

Next, a resist is applied, and lithography is performed. Channel ions of, e.g., boron or indium are implanted. The acceleration energy is 3 to 60 keV for boron and 30 to 300 keV for indium. The dose is $1\times10^{11}$ to $1\times10^{14}$ cm$^{-2}$. Unlike prior arts 1 and 2, the channel ions are implanted much deeper than the interface between the buffer layer 12 and the substrate 10 (and below the upper end portion of the side wall 14 of the trench 11). The implantation depth has a maximal value between 10 nm and 100 nm and is typically 30 nm or more. To improve the mobility, the impurity concentration on the surface is $10^{18}$ cm$^{-3}$ or less. The peak is deeper than the end of the channel depletion layer of the MISFET. The impurity concentration at the maximal value is preferably $10^{17}$ to $10^{20}$ cm$^{-3}$ to suppress expansion of the channel depletion layer.

The buffer layer 12 that is present on the surface in ion implantation has a shape projecting upward and becomes thick at the two side portions. For this reason, the channel-implanted ions have the maximal value near the surface at the side portion, and a section shown in FIG. 2E is obtained.

In the prior art, a sacrificial oxide film such as a silicon oxide film is formed after removing the buffer layer 12, and ions are implanted via the sacrificial oxide film. In this method, the above channel ion profile is not obtained. More specifically, since the sacrificial oxide film is oxidized from the upper and side surfaces of the semiconductor substrate, the sacrificial oxide film through which channel ions are implanted does not become thick at the side portion. For this reason, the above-described effect for forming the distribution of channel-implanted ions is formed near the surface at the side portion is not observed.

In this channel ion implantation process, for example, boron may be implanted at a dose of $1 \times 10^{11}$ to $1 \times 10^{14}$ cm$^{-2}$ and an acceleration energy of 100 to 1,000 keV to simultaneously form a well.

Next, as shown in FIG. 2F, the buffer layer 12 is removed using a solution of ammonium fluoride or diluted hydrofluoric acid. This etching is preferably performed such that the buffer layer 12 at the flat gate portion is completely removed, and the buffer layer 12 formed inside the major surface of the substrate 10 in the bird's beak region is left on the tilt surface of the substrate 10. Normally, the buffer layer 12 is a semiconductor thermal oxide film, and the insulating film 15 is a deposited oxide film which is coarser than the thermal oxide film. For this reason, the etching rate is higher for the insulating film 15 than for the buffer layer 12.

Next, a 1- to 200-nm thick gate insulating film 18 formed from an oxide film, silicon nitride film, silicon oxy-nitride film, tantalum oxide film, or titanium oxide film is deposited or formed by oxidizing or nitriding the semiconductor substrate. A polysilicon film doped with phosphorus or boron at $10^{19}$ cm$^{-3}$ or more or TiN, TaN, W, or Al is deposited to 10 to 300 nm. After this, lithography is performed to form the gate electrode 19, thereby obtaining the sectional structure shown in FIG. 1A. After this, although not illustrated, a source and drain are formed on both sides of the gate electrode 19 to complete a MISFET.

FIGS. 1B and 1C are enlarged views of the side portion Sc shown in FIG. 1A. Even when the gate insulating film 18 becomes thin, any decrease in the threshold voltage can be prevented by this embodiment.

This will be described below. FIG. 1B shows a case wherein the gate insulating film 18 is thicker on the side-portion tilt surface along the periphery of the trench of the substrate 10 than at the flat portion (main portion) of the substrate 10. FIG. 1C shows a case wherein the gate insulating film 18 is thin on the side-portion tilt surface.

Assume that Le is the thickness of the gate insulating film at the side portion, and Ld is the thickness of the gate insulating film at the flat portion (main portion). As shown in FIG. 1C, the buffer layer 12 or insulating film 14 remains on the side-portion tilt surface. For this reason, the gate insulating film on the side-portion tilt surface becomes thicker due to the remaining buffer layer 12 or insulating film 14 to satisfy Le>Ld.

Figure 4:
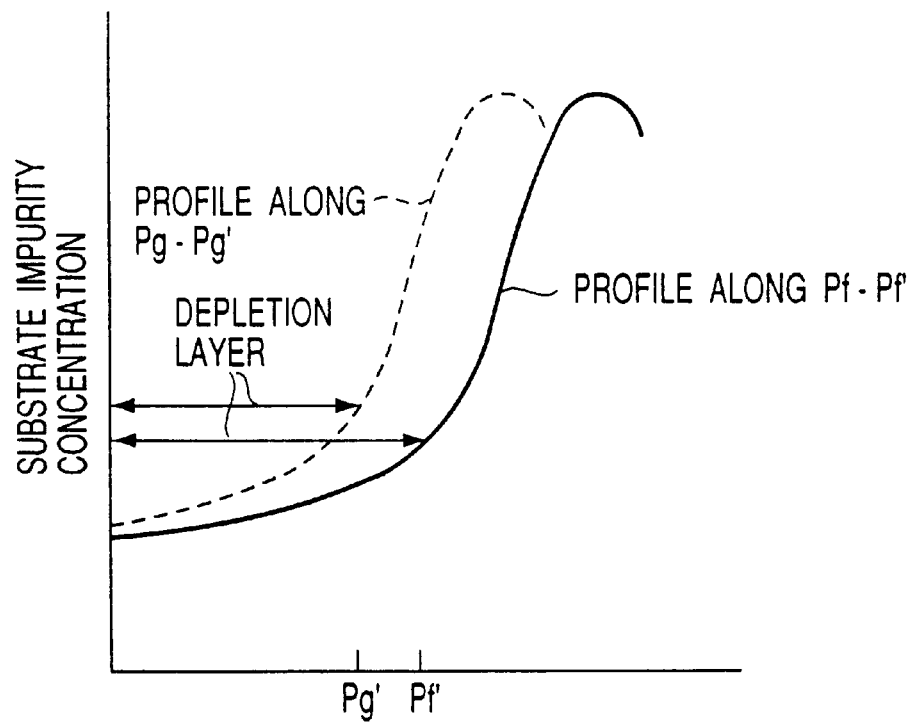
FIG. 4 is a graph showing the distributions of impurity concentrations.

In this case, as is apparent from equation (1), when a gate insulating film thickness t increases, a threshold voltage $V_{th}$ becomes high even when a value $Q_B$ does not change. In this embodiment, as shown in FIG. 4, the channel impurity concentration at the end of the channel depletion layer (when the threshold voltage is applied to the gate electrode 19) is higher than that at the interface between the gate insulating film 18 and the substrate 10, unlike the prior art. In such a retrograded channel structure, as the depletion layer depth becomes small, the threshold voltage rises. In the cases shown in FIGS. 1B and 1C, La>Lb holds, unlike the prior art, so the value $Q^B$ is larger in the transistor at the side portion. The reason for this is as follows. When the channel impurity concentration at the end of the depletion layer in the substrate is sufficiently higher than that at the interface between the gate insulating film 18 and the substrate 10, an electric field $E_s$ at the interface between the gate insulating film 18 and the substrate 10 is terminated by charges near the end of the depletion layer.

Where $V_{BS}$ is the substrate bias, and x is the distance from the interface between the gate insulating film 18 and the substrate 10 to the end of the depletion layer, the electric field $E_s$ when the threshold voltage is applied is given by $(2\phi_F + V_{BS})/x$. As the width x of the depletion layer becomes small, the surface field becomes strong. The voltage difference from the interface between the gate electrode 19 and the semiconductor substrate 10 via the gate insulating film 18 increases in proportion to the surface field. Consequently, even when the thickness of the gate insulating film 18 does not change, the threshold voltage rises as the width of the depletion layer becomes small. In this embodiment, a width Lb of the depletion layer at the side portion is smaller than a width La of the depletion layer at the main portion, i.e., La>Lb. For this reason, the value $Q_B$ in equation (1) becomes larger in the transistor at the side portion than in the transistor at the main portion.

In this embodiment, unlike the prior art, even when the gate insulating film 18 is thin on the side-portion tilt surface, as shown in FIG. 1C, i.e., Ld>Le, the value $Q_B$ in the transistor at the side portion is larger than that in the transistor at the main portion. For this reason, the threshold voltage $V_{th}$ increases.

As shown in FIG. 1C, when the end 20 of the depletion layer is shorter at the side portion than at the main portion, La >Lb holds under the condition for forming the side-portion tilt surface. In this case, the effect of this embodiment is attained.

Figure 6:
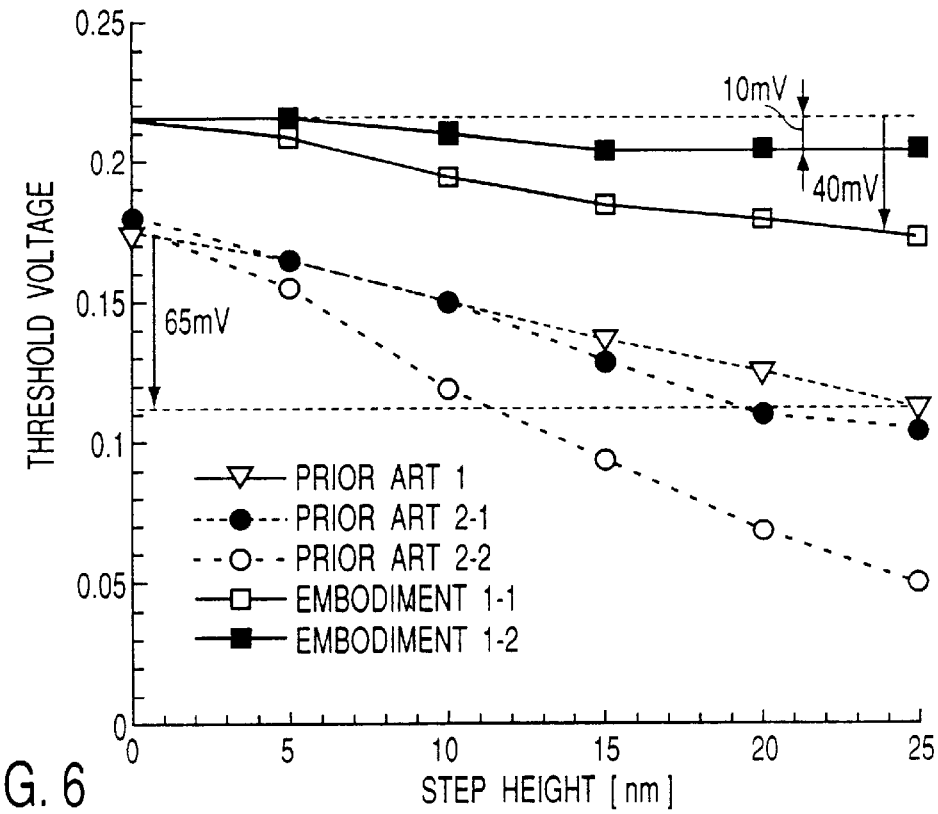
FIG. 6 is a graph showing the relationship between the step height and the threshold voltage.
Figure 15A:
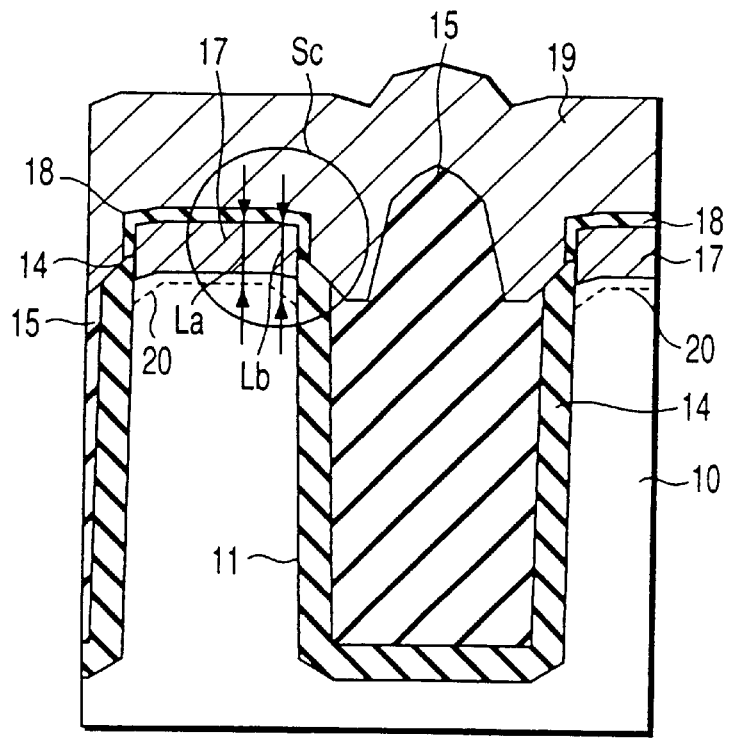
FIG. 15A is a sectional view showing a semiconductor device of prior art 1.
Figure 15B:
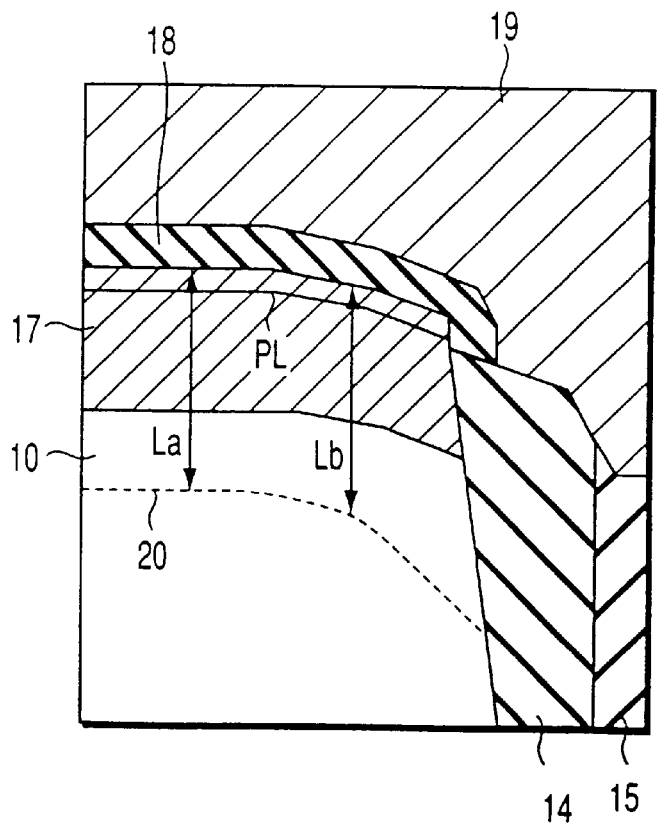
FIG. 15B is an enlarged view of a side portion Sc shown in FIG. 15A.
Figure 17:
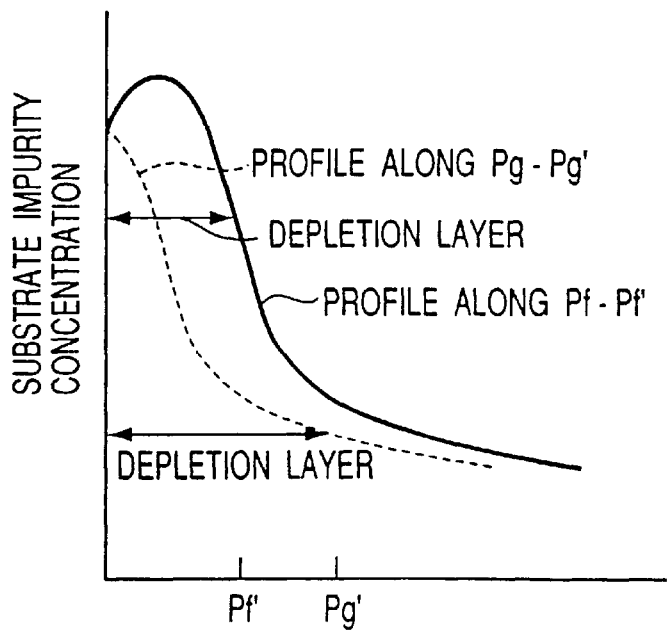
FIG. 17 is a graph showing the impurity profile at the flat portion in prior art 2.
Figure 18:
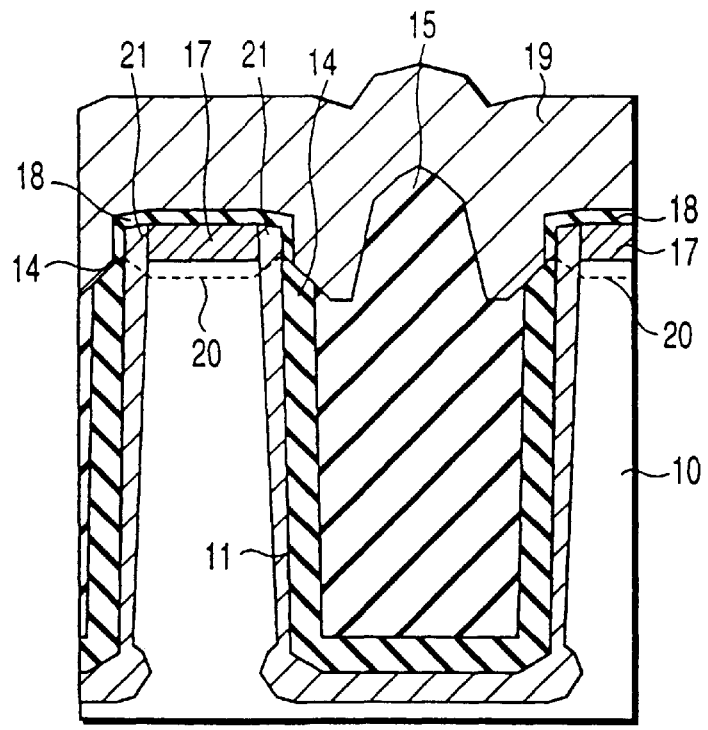
FIG. 18 is a sectional view showing prior art 3.

FIG. 6 shows the relationship between the step height and the threshold voltage so as to explain the effect of the above-described structure. Prior art 1 in FIG. 6 indicates the dependence of the threshold voltage on the step in the enlarged sectional structure shown in FIG. 5A corresponding to FIG. 15B. The channel width is 1 μm, and the thickness of the gate insulating film 18 at the main and side portions is 3 nm. This example is a surface channel-doped structure. As a channel impurity, boron is uniformly doped into the semiconductor substrate 10 at $3.5 \times 10^{16}$ cm$^{-3}$. Boron is further doped into this substrate with such a profile that the peak concentration is $2.5 \times 10^{18}$ cm$^{-3}$, the peak depth from the interface between the gate insulating film 18 and the substrate 10 is 5 nm, and the peak spread is 10 nm. When the gate voltage is 0V, the depletion layer expands to the lower side of the surface channel-doped region. The threshold voltage without the side effect is 0.2V.

Prior arts 2-1 and 2-2 in FIG. 6 represent the dependence of the threshold voltage on the step in the enlarged sectional structure shown in FIG. 5B corresponding to FIGS. 16B and 16C. The channel width is 1 μm. The thickness of the gate insulating film 18 at the main portion is 3 nm. The angle of the side-portion tilt surface is 45°, and its length in the horizontal direction is 25 nm. A thickness Lh of the gate insulating film 18 on the tilt surface is 3 nm in prior art 2-1, which is the same as that at the main portion, and 2 nm in prior art 2-2, i.e., smaller than that at the main portion. In these examples, a surface channel-doped structure having the same depth profile as in prior art 1 is formed. The channel impurity is ion-implanted into the main portion. However, the channel impurity rarely reaches the side-portion tilt surface because it is shielded by the insulating film 14 as a mask.

Embodiments 1-1 and 1-2 in FIG. 6 represent the dependence of the threshold voltage on the step in the enlarged sectional structure shown in FIG. 5C corresponding to FIGS. 1B and 1C. The channel width is 1 μm. The thickness of the gate insulating film 18 at the main portion is 3 nm. The angle of the side-portion tilt surface is 45°, and its length in the horizontal direction is 25 nm. The thickness Lh of the gate insulating film 18 on the tilt surface is 3 nm in embodiment 1-1, which is the same as that at the main portion, and 2 nm in embodiment 1-2, i.e., smaller than that at the main portion.

As a characteristic feature of this embodiment, a retrograded channel doped structure is used. As a channel impurity, boron is uniformly doped into the semiconductor substrate 10 at $3.5 \times 10^{16}$ cm$^{-3}$. Boron is further doped into this substrate with such a profile that the peak concentration is $1 \times 10^{19}$ cm$^{-3}$, the peak depth from the interface between the gate insulating film 18 and the substrate 10 is 30 nm, and the peak spread is 10 nm. The depletion layer stays on the surface side from the maximal value position of this retrograded channel doped structure. The threshold voltage without the side effect is 0.2V, i.e., the same as in the surface doped structure.

In this structure, as shown in FIG. 2E, channel ions are implanted into the side-portion tilt surface, like at the main portion. Channel ions are implanted into the tilt surface such that the distribution is bent to the surface side by, e.g., 22°. FIG. 4 shows an impurity profile example at the main portion along a line Pf–Pf' in FIG. 5C and an impurity profile example at the side portion along a line Pg–Pg'. Pf and Pg indicate the interfaces between the gate insulating film 18 and the substrate 10 at the main and side portions, respectively. Pf' and Pg' indicate the ends of the channel depletion layer at the main and side portions, respectively. Since the implantation depth is smaller at the side portion than at the main portion because of the buffer layer 12, ions are implanted near the surface at the side portion. When this retrograded channel doped structure is used, the depletion layer becomes narrower at the side portion.

Referring to FIGS. 5A, 5B, and 5C, the difference between the upper surface of the gate insulating film at the main portion and the lower end of the gate insulating film 18 on the side insulating film (side wall) 14 in the trench is called a step height.

The larger the step height becomes, the larger the influence of the side transistor becomes. For this reason, the threshold voltage drops. As shown in FIG. 6, in the prior arts, when the step height increases from 0 nm to 25 nm, the threshold voltage drops by 65 mV or more. Especially, when the thickness of the gate insulating film 18 on the tilt surface decreases from 3 nm to 2 nm in prior art 2, i.e., in prior art 2-2, the threshold voltage drop reaches 115 mv.

In this embodiment, even when the thickness of the gate insulating film 18 on the tilt surface decreases from 3 nm to 2 nm, i.e., even in embodiment 1-2, the threshold voltage drop is as small as 40 mV. This is 61% or less of that of the prior art. When the gate insulating film at the side portion does not becomes thin, the threshold voltage drop is 10 mV, i.e., smaller than 65 mV in the prior art, as is apparent from embodiment 1-1. At any step height, the increase in the threshold voltage drop is smaller in this embodiment than in the prior arts.

Figure 7:
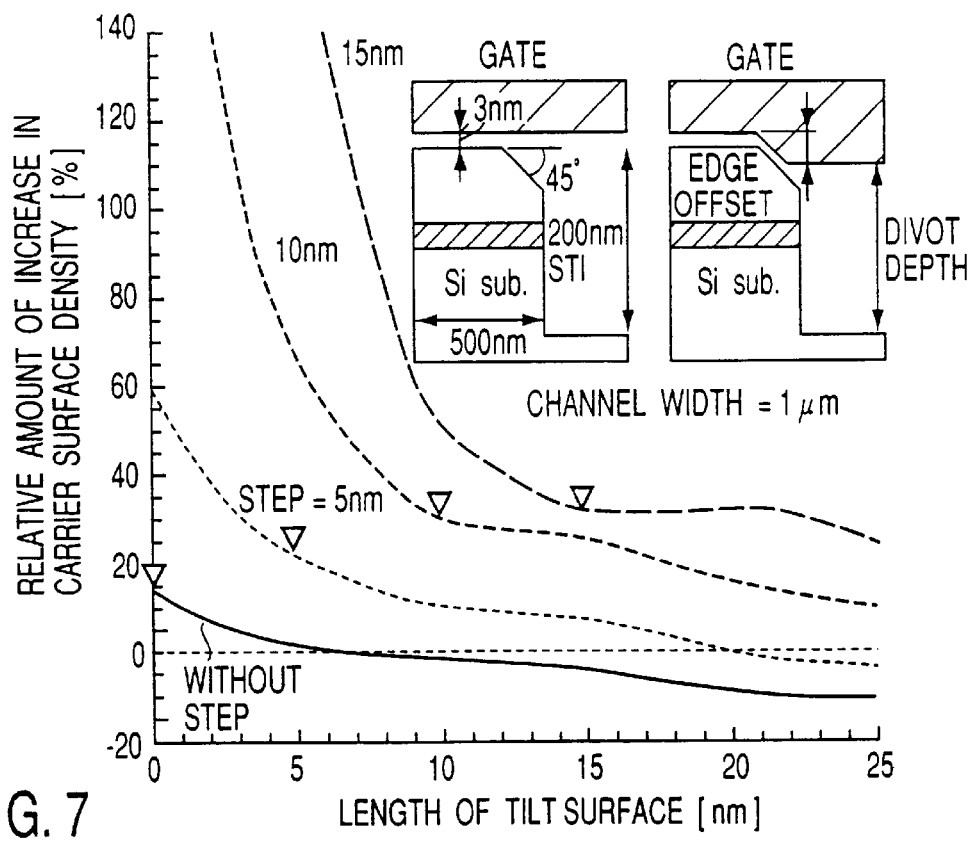
FIG. 7 is a view showing the relationship between the length of the side-portion tilt surface and the carrier increase amount.

It is found that this effect for suppressing the threshold voltage drop disappears when the gate electrode is formed even under the side-portion tilt surface, i.e., reaches the trench tilt surface formed by trench isolation. FIG. 7 is a view for explaining this effect. The abscissa represents the horizontal (gate major surface direction) length of the side-portion tilt surface, and the ordinate represents the ratio of an increase in the channel carrier concentration with reference to the inversion layer carrier density without the side effect. The parameter in FIG. 7 is the step. The structure is the same as in embodiment 1-1 described with reference to FIG. 5C except the horizontal length of the tilt surface. The tilt angle is 45°, and the gate insulating film thickness is 3 nm at both the main and side portions. The position indicated by each inverted triangle is the boundary between the side-portion tilt surface and the trench tilt surface. On the left side of this position, the gate electrode 19 extends downward until it reaches the trench tilt surface.

As is apparent from FIG. 7, when the gate electrode 19 reaches the trench tilt surface, the relative increase amount of carriers abruptly increases. That is, in this region, the inversion layer more easily forms at the side portion than at the main portion, and the threshold voltage largely drops. To prevent any drop in the threshold voltage, preferably, the gate electrode 19 does not extend to the lower side over the side-portion tilt surface.

Figure 8A:
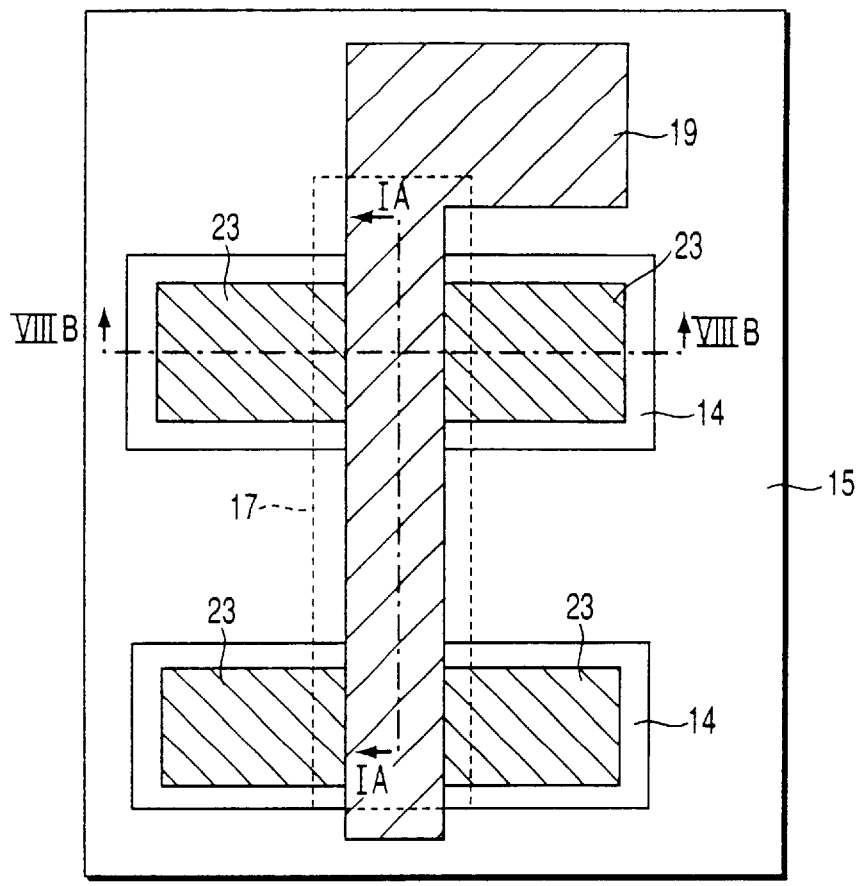
FIG. 8A is a plan view showing the first embodiment.
Figure 8B:
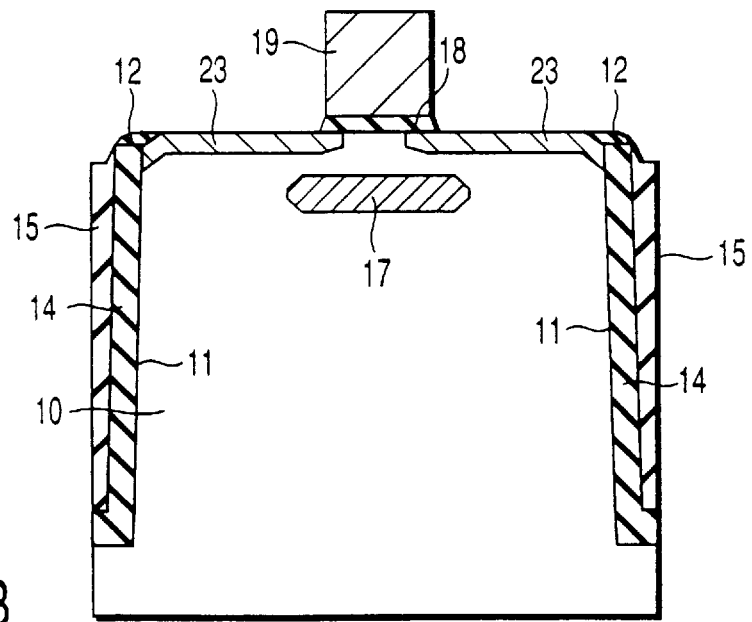
FIG. 8B is a sectional view showing a section perpendicular to the gate electrode of the first embodiment.

In prior arts 1, 2, and 3, a region with a high substrate concentration reaches the surface, and a p-n junction with a high concentration is formed between the source and drain regions having a conductivity type opposite to that of the substrate. For this reason, the tunnel leakage current from the junction or drain/source capacitance increase. This embodiment can prevent such a p-n junction having a high concentration. This structure will be described with reference to FIGS. 8A and 8B. FIG. 8A shows the two-dimensional layout of the gate electrode 19 and source and drain regions 23 in the first embodiment. FIG. 1A corresponds to the section taken along a line IA—IA in FIG. 8A. FIG. 8B corresponds to the section taken along a line VIIIB—VIIIB in FIG. 8A. This section includes the source and drain regions 23 and gate electrode 19.

As shown in the plan view of FIG. 8A, the channel-ion-implanted region 17 is formed only near the gate electrode 19. In this embodiment, as shown in the sectional view of FIG. 8B, the channel-ion-implanted region 17 is separated from the interface between the gate insulating film 18 and the substrate 10, unlike the prior arts. Additionally, the source and drain regions 23 are formed shallowly not to come into contact with the channel-ion-implanted region 17. Since the source and drain regions 23 oppose the substrate region which is doped more lightly than the channel-ion-implanted region 17, the capacitance between the source and drain regions 23 and the substrate 10 is small. This structure also prevents p-n junction with a high concentration and tunnel leakage current from the junction.

In the relationship between the distances La and Lb shown in FIGS. 1B and 1C, the present inventors have found, as a result of extensive examination, the sufficient condition for preventing any threshold voltage drop even when the field concentrates due to the side effect. This will be described below. FIG. 1D shows a case wherein in the retrograded channel doped structure as in FIG. 1B, the gate insulating film thickness Ld at the flat channel portion (main portion) equals the gate insulating film thickness Le at the channel side portion. Li, La, and La" represent values on the same section on the extended line of Ld. For the illustrative convenience, these are shown to be shifted from each other in FIG. 1D. Lj, Lb, and Lb" also represent values on the same section on the extended line of Le. The thickness Le can be measured at any position on the side-portion tilt surface.

In the retrograded channel doped structure shown in FIG. 1D, the distance (depth) from the boundary between the heavily-doped impurity region 17 and the lightly-doped impurity channel region 10 to the interface between the gate insulating film 18 and the channel region 10 is represented by Li at the main portion and Lj at the side portion. Since the amount of depletion layer charges contained in the depletion layer is given by the function of the distance Li, the depletion layer charge amount at the main portion when the threshold voltage is applied is represented by $Q_B(i)$. Where $2\phi_F$ is the inversion potential, $V^{FB}$ is the flat band voltage of the gate electrode, and Cox is the capacitance per unit area of the gate electrode, a threshold voltage $V_{th1}$ at the main portion is given by $$V_{th1}=V_{FB}+2\phi_F-Q_B(i)/Cox \qquad (2)$$

A threshold voltage $V_{th2}$ has been examined using the two-dimensional analysis model of the side portion. When the tilt angle of the trench 11 is smaller than 90°, and $V_{BS}$ is the substrate bias voltage, the threshold voltage $V_{th2}$ is given by $$V_{th2}>V^{FB}+2\phi_F-\{1-0.216(dV_{th1}/dV_{BS}) |i=j\}Q_B(j)/Cox \qquad (3)$$

When the threshold voltage $V_{th2}$ at the side portion is equal to or higher than the threshold voltage $V_{th1}$ at the main portion, the threshold voltage drop due to the side effect does not occur. For this purpose, equation (4) only need hold $$-Q_B(i)<-\{1-0.216(dV_{th1}/dV_{BS}) |i=j\}Q_B(j) \qquad (4)$$

where $dV_{th1}/dV_{BS}$ is the increase amount of the threshold voltage due to the increase in substrate bias voltage. This value is normally set at 1 to 1.5 because if it is large, the current drivability in the cascade-connected circuit decreases. Under the normal retrograded channel condition wherein the difference between the distance Li and the depth La at the depletion layer end in the heavily-doped impurity region 17, (Li–La) is sufficiently smaller than Li, $-Q_B(i) \approx k/Li$ can hold, for which k is a constant independently of Li. When Lj<0.676×Li, inequality (4) can be satisfied. When Ld≦Le, the threshold voltage drop due to the side channel can be prevented.

The distance (depth) from the interface between the gate insulating film 18 and the semiconductor substrate 10 to the peak position of the dopant impurity in the channel region is represented by La" at the main portion and Lb" at the side portion, as shown in FIG. 1D. The impurity spread from the peak position in the direction of depth at the main portion equals that at side portion. Hence, when Lb"<0.676×La", Lj<0.676×Li can be satisfied.

The sufficient condition of the depth of the peak position also applies to the other embodiments to be described later with reference to FIGS. 9B, 11B, and 13B.

The first embodiment with the above arrangement has the following characteristic features.

1) Even in a transistor in which the threshold voltage at the side portion in the element region rises, no side parasitic transistor is formed, and the gate width changes, a threshold voltage and sub-threshold swing coefficient with good uniformity can be realized. In an integrated circuit using a plurality of such transistors, the variations in switching speed and sub-threshold leakage current can be reduced. Hence, a more stable large-scale integrated circuit can be constructed.

2) The resist used for lithography for channel ion implantation does not come into direct contact with the semiconductor substrate 10. The upper portion of the insulating film 15 and a portion of the buffer layer 12, which is in contact with the resist, are removed in processes before gate formation. For this reason, the influence of contamination by organic materials or metals from the resist can be reduced as compared to prior art 3 in which the resist enters the trench. Unlike prior art 3, the lithography and ion implantation processes of implanting ions into the side walls can be omitted.

3) Unlike prior art 3, the increase in concentration of the substrate impurity at the interface between the gate insulating film 18 and the substrate 10 can be prevented. For this reason, any increase in interface traps of the gate insulating film due to the increase in concentration of the substrate impurity can be prevented. In prior art 3, ions are implanted into side walls before deposition of the insulating film 15. In the first embodiment, channel ions are implanted after the insulating film 15 is deposited. Hence, thermal diffusion of the channel ions in deposition and annealing processes of the insulating film 15 can be prevented, and the ion implantation profile can be made steeper. Furthermore, ions for preventing any threshold voltage drop are implanted into only the side portion in the element region in the same process as channel ion implantation, and the dose is the same as that of channel ions. The ions are not implanted into the side or bottom surfaces of the trench at a high concentration. For this reason, any defects on the trench bottom surface due to this ion implantation can be prevented.

4) As compared to prior art 1, this embodiment can be implemented without increasing the number of processes.

5) Even when the gate insulating film 18 becomes thin at the side portion, the threshold voltage drop can be prevented. Hence, as compared to prior art 2 that requires to increase the gate thickness at the side portion, the process margin for the gate thickness can be increased. Especially, because hardly any restraint condition for increasing the gate thickness at the side portion is necessary, a transistor with more satisfactory breakdown voltage characteristics or uniform gate thickness can be obtained by forming the gate with a gate formation method with good uniformity.

6) Even when the gate electrode 19 has a large step, any threshold voltage drop can be prevented. Hence, the process margin in removing the insulating film 12 before formation of the gate insulating film 18 can be increased.

7) In this embodiment, the trench isolation insulating film 14 is not formed on the tilt. surface at the side portion in the element region, unlike prior art 2. For this reason, channel ions are also implanted to the tilt surface at the side portion, and any threshold voltage drop of the side transistor can be prevented. In addition, even when the insulating film 15 is formed by an insulating film deposition method with which defects are generated in the tilt surface with a small angle due to the sputtering effect, defects hardly form in the tilt surface at the side portion in this embodiment. Even when the insulating film 15 is deposited by $SiO_2$ deposition using, e.g., high-density plasma CVD, the insulating film can be deposited without generating any defects at the side portion.

8) Since the heating process of forming the side-portion tilt surface need not be performed after channel ion implantation, a steep channel profile with a small spread due to the heat process can be realized as compared to the second embodiment (to be described later).

(Second Embodiment)

Figure 9A:
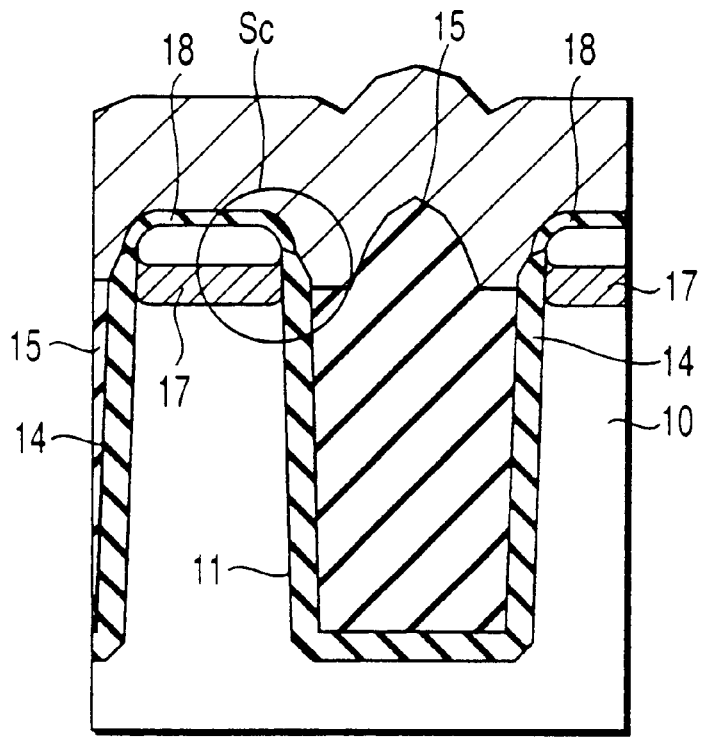
FIG. 9A is a sectional view showing a semiconductor device according to the second embodiment.
Figure 9B:
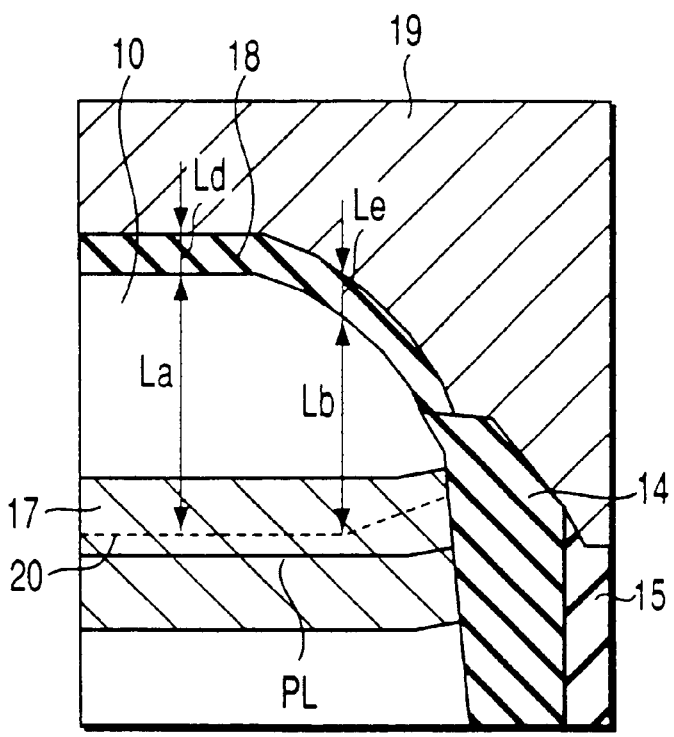
FIG. 9B is an enlarged view of a side portion Sc shown in FIG. 9A.

FIGS. 9A and 9B show a structure according to the second embodiment of the present invention.

The second embodiment is different from the first embodiment in that the gate insulating film at the side portion is formed from only a gate insulating film 18, the depth distribution of channel implantation ions at the side portion is flatter, and the side-portion tilt surface is formed by another method. In this embodiment, the side-portion tilt surface is formed by round oxidation after removing a buffer layer 12.

The steps in the manufacture according to the second embodiment will be described with reference to FIGS. 10A to 10F.

First, as in FIG. 2A, a 10- to 500-nm thick etching stopper film 13 of silicon nitride, polysilicon, or amorphous silicon is deposited on the entire surface of a semiconductor substrate 10 containing silicon via a 5- to 50-nm thick buffer layer 12 formed from a silicon oxy-nitride film or silicon oxide film. This etching stopper film 13 preferably has a thickness of 10 nm or more for the purpose of decreasing the stress of the etching stopper film 13 or etching damage to the semiconductor substrate 10 when the film 13 is etched and removed.

Subsequently, lithography and etching are performed to form a trench 11 to a depth of 0.1 to 2 $\mu$m until it reaches the substrate 10. The tilt angle of the trench 11 is 70° to 90° and, more preferably, 80° to 89° to suppress an increase in the width due to the tilt angle of element isolation and obtain satisfactory element isolation characteristics. To maintain satisfactory electrical isolation from other elements, this trench is preferably formed around the element formation region.

Next, to reduce surface defects in the substrate 10, the structure is annealed in an oxygen atmosphere to form the 5- to 100-nm thick silicon oxide film 14 in the trench 11. During formation of this oxide film, oxidation of the substrate 10 progresses from the side surface due to oxidation species such as oxygen or $H_2O$ entering the buffer layer 12. For this reason, the buffer layer 12 becomes thicker at the side portion near the trench than at the flat portion.

In the second embodiment, it is preferable to prevent tilt surface formation due to the bird's beak in the manufacture processes, unlike the first embodiment. The tilt surface at the side portion is preferably small. For this purpose, the silicon oxide film 14 is formed by dry oxidation in which the diffusion rate of oxidation species in the oxide film is lower than that of wet oxidation or by oxidation while adding hydrochloric acid. A small tilt surface is formed on the upper surface of the side portion of the substrate 10 by the bird's beak. At this time, the volume of the buffer layer 12 increases due to oxidation of the bird's beak. Since the volume increases from the flat substrate portion (main portion) toward the side portion, parts projecting upward are formed at the two side portions of the buffer layer 12.

Figure 10A:
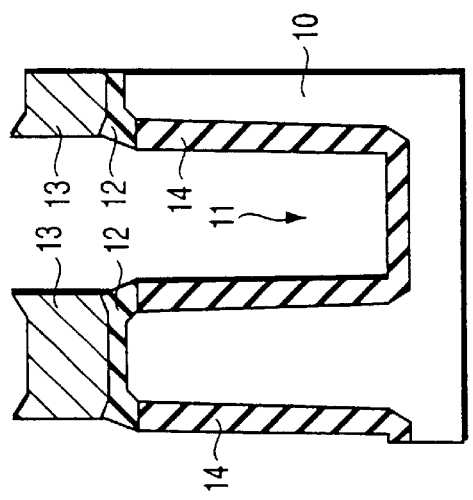
FIGS. 10A to 10F are sectional views showing the steps in the manufacture of the semiconductor device according to the second embodiment.
Figure 10B:
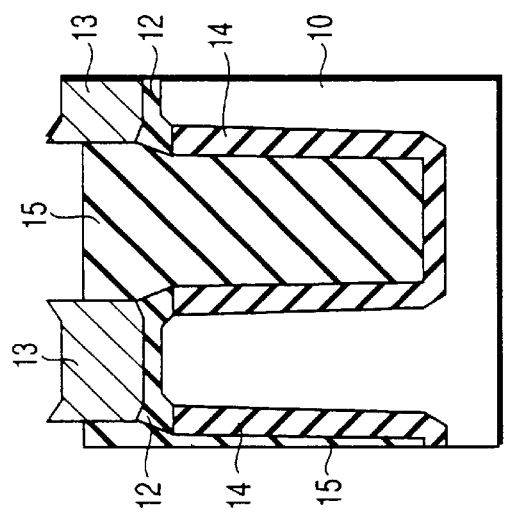

Next, as shown in FIG. 10B, a silicon oxide film as an insulating film 15 is deposited to a thickness of 0.1 to 2 $\mu$m that is sufficient to fill the trench 11. After this, the structure may be annealed in an $H_2O$, or Ar or $N_2$ atmosphere at 800° C. to 1,100° C. to make the structure of the insulating film 15 denser. Etch-back or CMP is performed until the etching stopper film 13 is exposed.

Figure 10C:
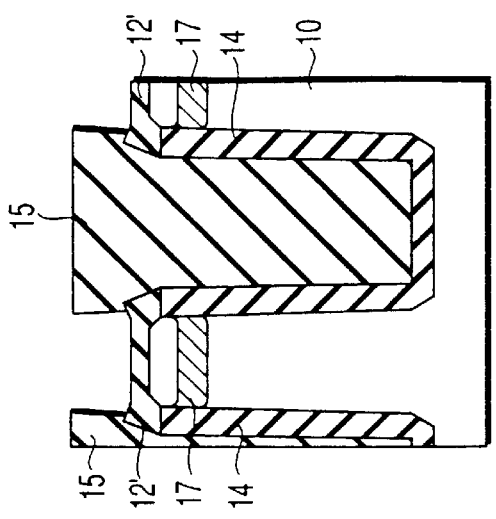

As shown in FIG. 10C, the etching stopper film 13 is removed by etching with selectivity to the buffer layer 12 and insulating film 14. For example, when the film 13 is a silicon film, etching is performed using a gas plasma containing $CF_4$ and $O_2$. When the film 13 is an SiN film, etching is performed using phosphoric acid heated to 80° C. to 200° C.

To optimize the thickness of the insulating film for ion implantation, the buffer layer 12 is removed. A 5- to 60-$\mu$m thick buffer insulating film 12' of a silicon oxide film may be formed by oxidizing/nitriding. When the insulating film 12' is to be formed, the side portion left on the trench side wall of the substrate 10 is prevented from rounding.

Next, a resist is applied, and lithography is performed. Channel ions of, e.g., boron or indium are implanted. The acceleration energy is 3 to 50 keV for boron and 30 to 300 keV for indium. The channel ions are implanted into a desired region at a dose of $1\times10^{11}$ to $1\times10^{14}$ $cm^{-2}$.

Unlike prior art 1, the channel ions are implanted much deeper than the interface between the insulating film 12' and the substrate 10. This implantation depth has a maximal value between 10 nm and 100 nm and is typically 30 nm or more. To improve the mobility, the impurity concentration at the interface between the insulating film 12' and the substrate 10 is $10^{18}$ $cm^{-3}$ or less. The peak is deeper than the end of the channel depletion layer. The impurity concentration at the maximal value is preferably $10^{17}$ to $10^{20}$ $cm^{-3}$ to suppress expansion of the channel depletion layer.

In this channel ion implantation process, boron may be implanted at a dose of $1\times10^{11}$ to $1\times10^{14}$ $cm^{-2}$ and an acceleration energy of 100 to 1,000 keV to simultaneously form a well.

Figure 10D:
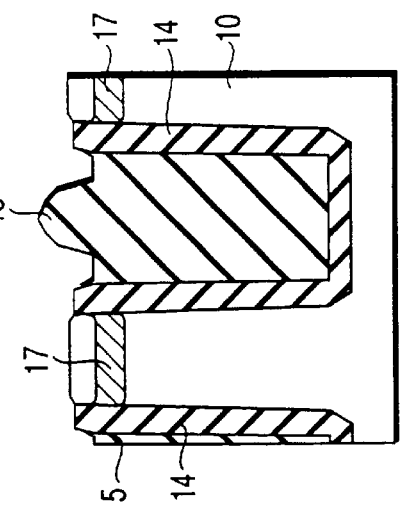

Next, the insulating film 12' is removed using a solution of ammonium fluoride or diluted hydrofluoric acid. This etching is preferably performed such that the insulating film 12' at the flat gate portion is completely removed. Normally, the insulating film 12' is a semiconductor thermal oxide film, and the insulating film 15 is a deposited oxide film which is coarser than the thermal oxide film. For this reason, the etching rate is higher for the film 15 than for the film 12'. The sectional structure shown in FIG. 10D is formed, and the insulating film 15 is at a level lower than the surface of the substrate 10.

Figure 10E:
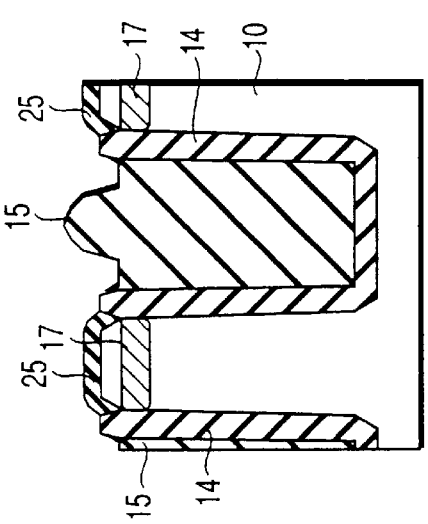

The semiconductor surface is oxidized to 5 to 100 nm in an $H_2O$ or $O_2$ atmosphere as an oxidation atmosphere at 700° C. to 1,100° C. to form a thermal oxide film 25. Since the substrate 10 is oxidized from the side surface via the insulating film 14, oxidation progresses at the side portion of the substrate 10 from the side and upper surfaces. Hence, a tilt shape having a round side portion of the substrate 10 is formed, as shown in FIG. 10E. When oxidation is performed under an oxidation condition for decreasing the viscosity of the insulating film 14 and stress applied to the substrate 10, e.g., at a high temperature, a rounder shape is obtained.

Figure 10F:
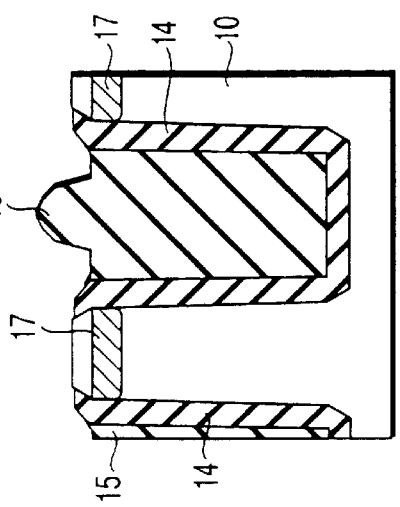

Next, the oxide film 25 is removed using a solution of ammonium fluoride or diluted hydrofluoric acid. Since the insulating film 15 is a deposited oxide film which is coarser than the thermal oxide film 14 or 25, the etching rate is higher for the film 15 than for the film 14 or 25. Hence, the sectional structure shown in FIG. 10F is formed. With this method, the surface can be rounded without damage upon etching.

Figure 11A:
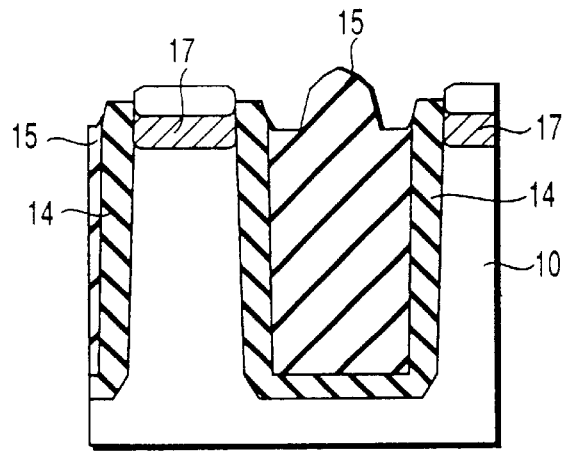
FIGS. 11A and 11B are sectional views showing a modification of the manufacturing process of the second embodiment.
Figure 11B:
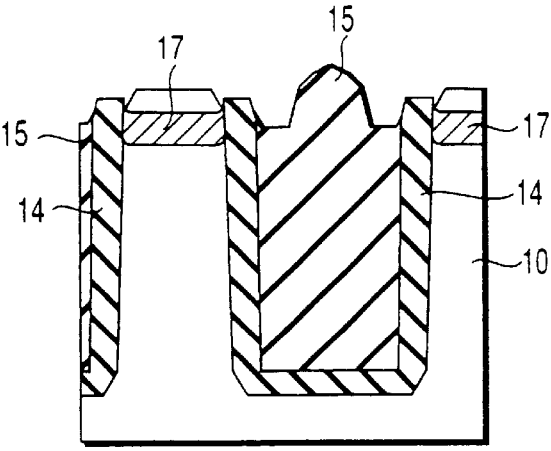

Instead of forming and removing the insulting film 25, the surface of the semiconductor substrate 10 may be rounded to form a tilt by processes shown in FIGS. 11A and 11B. First, the structure shown in FIG. 10B is formed, and the etching stopper film 13 is removed. In the following process of removing the buffer layer 12 using a solution of ammonium fluoride or diluted hydrofluoric acid, the buffer layer 12 at the flat gate portion is completely removed, and the insulating film 14 on the side surface is also etched until the side surface of the substrate 10 is exposed. The length of the exposed region along the side surface is 5 to 100 nm. The exposed region is formed at a level higher than the peak position of the previously formed ion-implanted region, thereby obtaining the structure shown in FIG. 11A.

The substrate 10 is etched by 5 to 50 nm by a gas plasma using $CF_4$ and $O^2$ to round the side portion, as shown in FIG. 11B. Since the exposed substrate 10 is etched from the side and upper surfaces, the side portion of the substrate 10 is rounded, as shown in FIG. 11B. In this manufacturing method, the number of heating steps is smaller than in the method of rounding the side portion by oxidation. For this reason, the channel profile can be made steeper.

In the rounding process shown in FIG. 11B after the process shown in FIG. 11A, not etching but a process using diluted hydrofluoric acid is performed not to form any native oxide film on the surface of the Si substrate, and the structure may be annealed in a vacuum atmosphere at a pressure $10^{-5}$ Pa or in a hydrogen gas at 600° C. to 1,100° C. to round the surface. The angle of the tilt surface in this side-portion tilt surface formation process is preferably 5° to 60° and, more preferably, 30° to 46° to obtain the effect for suppressing a decrease in threshold voltage while preventing any decrease in the channel width due to the tilt.

The subsequent process is common to the rounded structure shown in FIG. 11B and that shown in FIG. 10F. The 1- to 200-nm thick gate insulating film 18 formed from a silicon oxide film, silicon nitride film, silicon oxy-nitride film, tantalum oxide film, or titanium oxide film is deposited or formed by oxidizing or nitriding the semiconductor substrate. A polysilicon film doped with phosphorus or boron at $10^{19}$ $cm^{-3}$ or more or TiN, TaN, W, or Al is deposited to 10 to 300 nm. After this, lithography is performed to form a gate electrode 19, thereby obtaining-the sectional structure shown in FIG. 9A. After this, although not illustrated, a source and drain are formed on both sides of the gate electrode 19 to complete a MISFET.

FIG. 9B is an enlarged view of a side portion Sc shown in FIG. 9A. A line PL in FIG. 9B indicates the position of the peak of the dopant concentration in the channel region. In this embodiment, as shown in FIG. 4, the channel impurity concentration at the end of the channel depletion layer is higher than that at the interface between the gate insulating film 18 and the substrate 10. In such a retrograded channel structure, as the depth of the depletion layer becomes small, the threshold voltage rises. In the case shown in FIG. 9B, La>Lb holds, unlike the prior art, so a value $Q_B$ is larger in the transistor at the side portion under the tilt surface. The reason for this is as follows. When the channel impurity concentration at the end of the depletion layer is sufficiently higher than that at the interface between the gate insulating film 18 and the substrate 10, an electric field $E_s$ at the interface between the gate insulating film 18 and the substrate 10 is terminated by charges at the end of the depletion layer.

When the substrate bias voltage is 0V, the electric field $E_s$ when the threshold voltage is applied is given by $2\phi_F/x$ where x is the distance from the interface between the gate insulating film 18 and the substrate 10 to the end of the depletion layer. As the width x of the depletion layer becomes small, the surface field becomes strong. The voltage difference between the gate electrode 19 and the interface of the semiconductor substrate 10 via the gate insulating film 18 increases. Consequently, even when the thickness of the gate insulating film 18 does not change, the threshold voltage rises as the width of the depletion layer becomes small. In this embodiment, a width Lb of the depletion layer at the side portion is smaller than a width La of the depletion layer at the main portion, i.e., La>Lb because of formation of the side-portion tilt surface. For this reason, the value $Q_B$ in equation (1) becomes larger in the transistor at the side portion than in the transistor at the main portion.

In this embodiment, unlike the prior art, even when the gate insulating film 18 is thin on the side-portion tilt surface, as shown in FIG. 9B, i.e., Ld>Le, the value $Q_B$ in the transistor at the side portion is larger than that in the transistor at the main portion. For this reason, a threshold voltage $V_{th}$ increases.

Figure 12A:
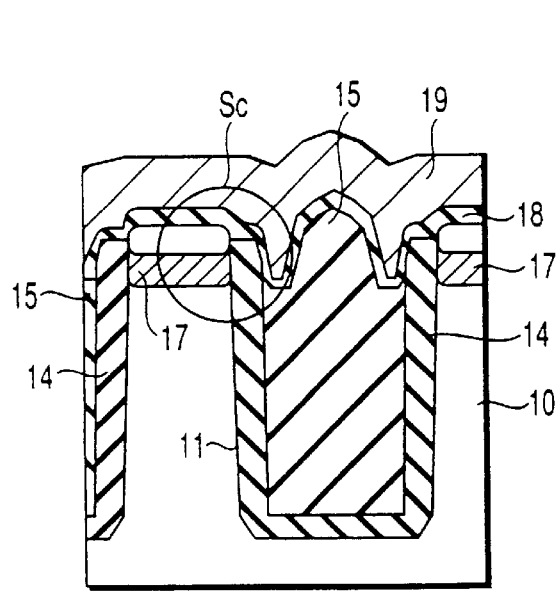
FIG. 12A is a sectional view showing a semiconductor device according to the modification of the second embodiment.
Figure 12B:
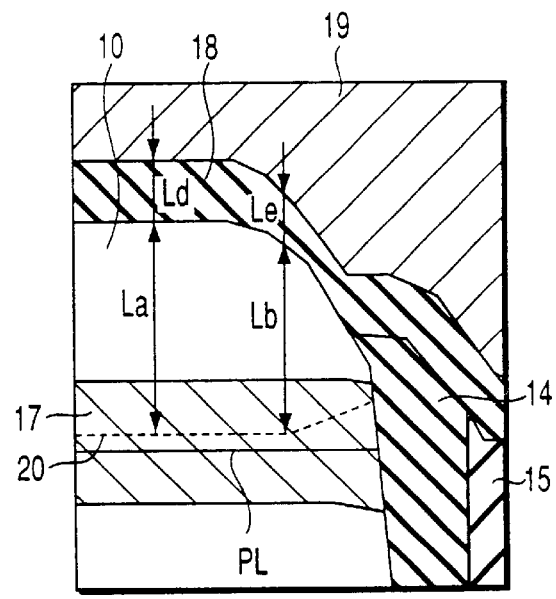
FIG. 12B is an enlarged view of a side portion Sc shown in FIG. 12A.

FIGS. 12A and 12B show a modification of this embodiment. FIG. 12A is a sectional view corresponding to FIG. 9A, and FIG. 12B is an enlarged view of a side portion Sc shown in FIG. 12A. A line PL in FIG. 12B indicates the position of the peak of the dopant concentration in the channel region. In the modification of the second embodiment, a silicon nitride film, tantalum oxide film, or titanium oxide film having a thickness of 1 to 200 nm is deposited to form the gate insulating film 18. In this case, the gate insulating film 18 is formed on the side-portion tilt surface and flat portion (main portion) of the substrate 10, as shown in FIG. 12A. In a film deposition method with poor coverage, the insulating film thickness Le on the tilt surface having an angle with respect to the major surface of the semiconductor substrate is smaller than the gate insulating film thickness Ld at the main portion. In the structure of this embodiment, however, since the depletion layer thickness Lb on the side-portion tilt surface is smaller than the depletion layer thickness La at the main portion, and the value $Q_B$ in the transistor at the side portion is larger than that in the transistor at the main portion, the threshold voltage $V_{th}$ increases.

In this embodiment, to increase the threshold voltage at the side portion, it is important to satisfy La>Lb. As shown in the enlarged view of FIG. 12B, La>Lb suffices even when the profile (impurity-implanted region 17) of implanted channel ions is flat or projects downward, as is apparent from the above description and FIG. 12B.

The second embodiment with the above arrangement has the following characteristic feature in addition to the characteristic features 1) to 7) of the first embodiment.

8) Since the bird's beak oxidation process is not performed in forming the side-portion tilt surface, a tilt angle larger than that obtained by deposition and expansion of an oxide film, e.g., a tilt angle of about 45° can be easily realized, and an arbitrary tilt angle can be realized. Hence, any decrease in channel width due to tilt angle formation can be suppressed, and the tilt angle of the side-portion tilt surface and the ion implantation profile at the main and side portions can be independently controlled.

(Third Embodiment)

Figure 13A:
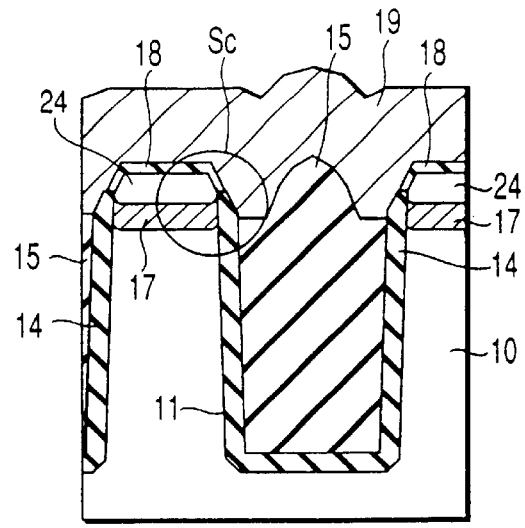
FIG. 13A is a sectional view showing a semiconductor device according to the third embodiment.
Figure 13B:
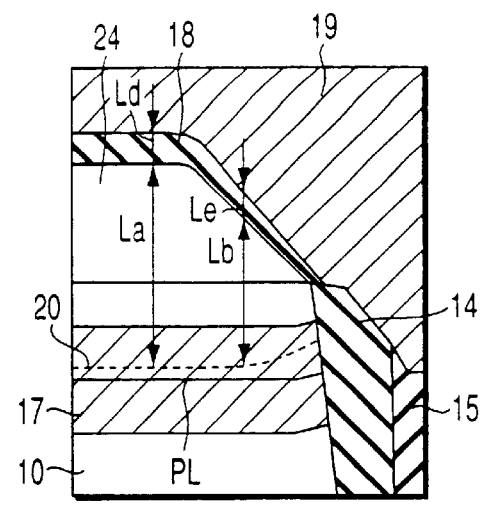
FIG. 13B is an enlarged view of a side portion Sc shown in FIG. 13A.

FIGS. 13A and 13B show a structure according to the third embodiment of the present invention. FIG. 13B is an enlarged view of a side portion Sc shown in FIG. 13A. A line PL in FIG. 13B indicates the position of the peak of the dopant concentration in the channel region. The third embodiment is different from the second embodiment in that semiconductor selective growth is used to form the side-portion tilt surface.

Figure 14A:
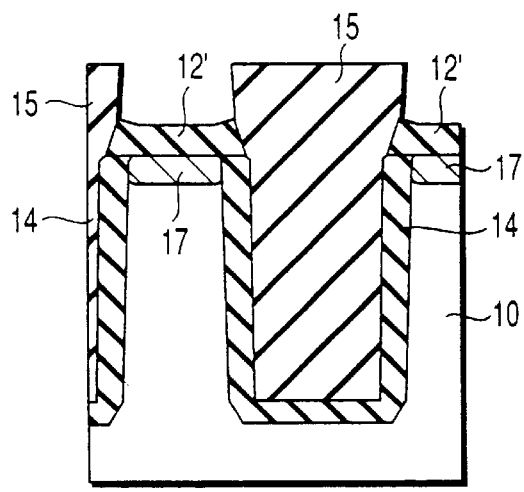
FIGS. 14A to 14C are sectional views showing the steps in the manufacture of the semiconductor device according to the third embodiment.
Figure 14B:
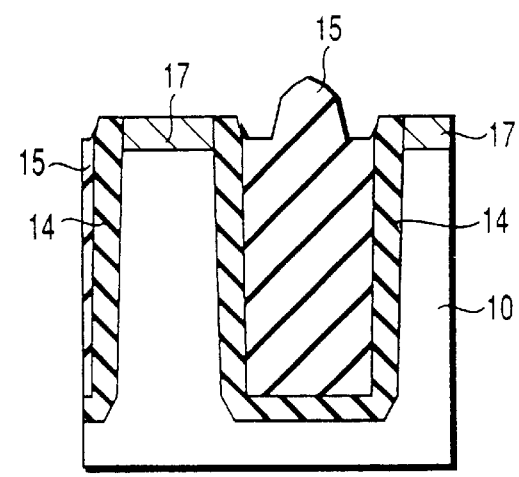
Figure 14C:
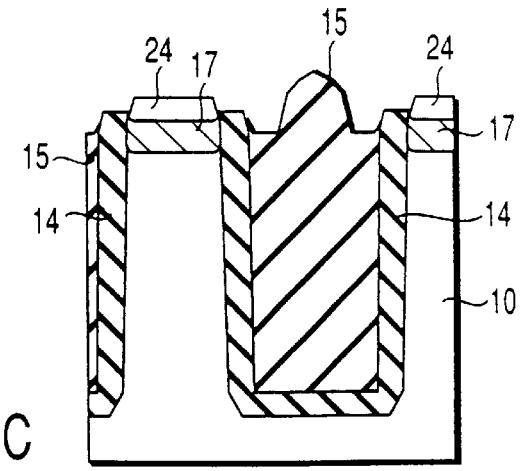

The steps in the manufacture according to the third embodiment will be described with reference to FIGS. 14A to 14C. The steps until the structure shown in FIG. 14A is formed are the same as in the second embodiment (up to FIG. 10C) except the channel ion implantation condition for formation of a channel-ion-implanted layer 17.

In channel ion implantation of this embodiment, channel ions of boron or indium are used. The acceleration energy is 3 to 30 keV for boron and 30 to 300 keV for indium. The channel ions are implanted into a desired region at a dose of $1 \times 10^{11}$ to $1 \times 10^{14}$ cm$^{-2}$. Unlike the first and second embodiments, the channel ion implantation depth may be set near the interface between a buffer insulating film 12' and a semiconductor substrate 10, or a retrograded structure may be formed by semiconductor selective growth later. This implantation depth has a maximal value between 0 nm and 90 nm. The impurity concentration at the ion implantation maximal value is preferably $10^{17}$ to $10^{20}$ cm$^{-3}$ to suppress expansion of the channel depletion layer.

Next, the insulating film 12' is removed by a solution of ammonium fluoride or diluted hydrofluoric acid. For tilt shape formation later, etching is preferably performed such that the insulating film 12' at the flat substrate portion (main portion) is completely removed, and the side surface of the substrate 10 is covered with an insulating film 14. Normally, the insulating film 12' is a semiconductor thermal oxide film, and an insulating film 15 is a deposited oxide film which is coarser than the thermal oxide film. For this reason, the etching rate is higher for the insulating film 15 than for the film 12'. Hence, the sectional structure shown in FIG. 14B is formed, and the film 15 is at a level lower than the surface of the substrate 10.

Next, a semiconductor region 24 of Si or SiGe is selectively grown on the exposed surface of the substrate 10 using a gas of SiH$_4$, SiH$_2$Cl$_2$, SiHCl$_3$, SiCl$_4$, GeH$_4$, or the like at 400° C. to 1,000° C. The impurity concentration of the semiconductor region 24 is set to be $10^{18}$ cm$^{-3}$ or less to improve mobility. The film thickness of the semiconductor region 24 is 10 to 200 nm and is typically 30 nm or more such that the threshold voltage of the MISFET obtains an appropriate design value from 0 to 0.7V.

The interface between the substrate 10 and the semiconductor film 24, which coincides with the major surface of the substrate 10, is defined as the [001] plane. X- and Y-axes are set along the major surface (horizontal direction) of the substrate 10. A trench side surface is formed along the <110> direction. Under an appropriate condition for selective growth, a {113} facet plane is formed on the side surface of semiconductor film 24. The angle made by the [001] plane and {113} plane is 25°. The tilt angle can be stably formed using the facet.

The third embodiment with the above arrangement has the following characteristic features in addition to the characteristic features 1) to 3) and 5) to 7) of the first embodiment.

9) Although ion implantation inevitably causes implantation spread, when the process of growing the semiconductor region 24 is performed at 700° C. or less, the impurity concentration at the interface between a gate insulating film 18 and the semiconductor layer 24 can be decreased, and the peak impurity concentration in the ion region 17 can be increased. For this reason, a transistor less influenced by degradation in mobility due to impurity scattering can be realized.

10) In the process of forming the side-portion tilt surface, a tilt depending on the crystal face orientation can be formed on the upper surface of the semiconductor region 24. Since the angle of this surface is fixed by the crystal face orientation, a tilt shape can be stably formed without any influence of the dependence on pattern, coverage, or grown film thickness.

The present invention is not limited to the above-described embodiments. The insulating film need not always be formed by oxide film formation using thermal oxidation. Instead, an oxide film may be formed by implanting oxygen at a low acceleration energy of about 30 keV. An insulating film may be deposited, a silicon nitride film may be deposited, or combination of these methods may be used. Especially, the buffer insulating film may be a silicon oxy-nitride film.

To form the element isolation insulating film or other insulating films, not only the method of converting silicon into a silicon oxide film or a silicon nitride film but also a method of, e.g., implanting oxygen ions into deposited silicon or oxidizing deposited silicon can be used. These insulating films and, more particularly, the gate insulating film can be formed using a single layer of a ferroelectric film or paraelectric film such as strontium titanate, barium titanate, lead zirconate titanate (PZT), or a composite film thereof.

In the above embodiments, a p-type Si substrate is used as the semiconductor substrate. Instead, an n-type Si substrate or an SOI silicon layer of an SOI substrate, GaAs substrate, or InP substrate may be used. Particularly, for a partially depleted MISFET formed on an SOI substrate, a side parasitic transistor effect can be obtained by forming a tilt surface, like a MISFET formed on a bulk substrate.

The present invention can be applied not only to an n-type MISFET but also to a p-type MISFET. To do this, the n-type in the above embodiments is replaced with the p-type. Sb as the dopant impurity species is replaced with In, and As or P is replaced with B. For ion implantation, As, P, or Sb is replaced with one of In, B, and BF$_2$. For the semiconductor substrate, an SiGe mixed crystal or SiGeC mixed crystal can be used.

For the gate electrode, single-crystal silicon, polysilicon, porous silicon, amorphous silicon, SiGe mixed crystal, SiGeC mixed crystal, GaAs, a metal such as W, Ta, Ti, Hf, Co, Pt, or Pd, or a silicide thereof can be used. A multilayered structure of these materials may be used. The gate electrode may be buried in the gate region after the source and drain layers are formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A field effect transistor comprising:
   a semiconductor substrate;
   a channel region of a second conductivity type formed in a surface of said substrate and a pair of source/drain regions of a first conductivity type formed in the surface of said substrate, the source/drain regions opposing each other via the channel region in a channel length direction;
   a gate electrode arranged above the channel region and opposing the channel region via a gate insulating film; and
   a trench formed in the surface of said substrate so as to define an element isolation region adjacent to the channel region in a channel width direction, the channel width direction being perpendicular to the channel length direction, and the trench being covered with an insulating trench side wall, wherein the channel region has a main portion having an upper surface of at a level higher than an upper end portion of the trench side wall, and a side portion having an upper surface tilting downward from the main portion to the upper end portion of the trench side wall in the channel width direction, the channel region contains a dopant impurity of the second conductivity type which has a concentration peak whose part in said main portion is arranged at a level below the upper end portion of the trench side wall, and the gate insulating film has a portion on the side portion, which is thinner than that of the gate insulating film on the main portion.

2. A field effect transistor comprising:

a semiconductor substrate;

a channel region of a second conductivity type formed in a surface of said substrate and a pair of source/drain regions of a first conductivity type formed in the surface of said substrate, the source/drain regions opposing each other via the channel region in a channel length direction; and a trench formed in the surface of said substrate so as to define an element isolation region adjacent to the channel region in a channel width direction, the channel width direction being perpendicular to the channel length direction, and the trench being covered with an insulating trench side wall, wherein the channel region has a main portion having an upper surface at a level higher than an upper end portion of the trench side wall, and a side portion having an upper surface tilting downward from the main portion to the upper end portion of the trench side wall in the channel width direction, and the channel region contains a dopant impurity of the second conductivity type which has a concentration peak whose part in said main portion is arranged at a level below the upper end portion of the trench side wall.

3. The transistor according to claim 2, wherein the concentration of the dopant impurity is not more than $10^{18}$ cm$^{-3}$ on the upper surface of the main portion and $10^{17}$ to $10^{20}$ cm$^{-3}$ at the peak.

4. The transistor according to claim 2, wherein an angle made by the trench side wall and the upper surface of the main portion is 70° to 90°, and an angle made by the upper surface of the main portion and that of the side portion is 5° to 60°.

5. The transistor according to claim 2, wherein a first distance from the upper surface of the main portion to the peak is not less than 30 nm.

6. The transistor according to claim 2, wherein the peak at the side portion is located at a level higher than that at the main portion.

7. The transistor according to claim 6, wherein the peak at the side portion gradually tilts upward toward the trench side wall.

8. The transistor according to claim 2, further comprising a gate electrode arranged above the channel region and opposing the channel region via a gate insulating film.

9. The transistor according to claim 8, wherein said gate electrode has a downward extending portion extending in the trench, and a lower end portion of the downward extending portion, which comes into contact with the trench side wall, is located at a level higher than the peak.

10. The transistor according to claim 8, wherein the gate insulating film has a portion on the side portion, which is thinner than that of the gate insulating film on the main portion.

11. The transistor according to claim 8, further comprising a buffer insulating film formed, independently of the gate insulating film, from the upper end portion of the trench side wall to the upper surface of the side portion.

12. The transistor according to claim 11, wherein said buffer insulating film is thicker at the upper end portion of the trench side wall than at the side portion.

* * * * *